United States Patent
Yamazaki et al.

(10) Patent No.: US 10,327,366 B2
(45) Date of Patent: Jun. 18, 2019

(54) CONVEYANCE ROBOT APPARATUS

(71) Applicant: Panasonic Intellectual Property Management Co., Ltd., Osaka (JP)

(72) Inventors: Takuto Yamazaki, Nara (JP); Eiji Fujita, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/659,862

(22) Filed: Jul. 26, 2017

(65) Prior Publication Data

US 2017/0325368 A1    Nov. 9, 2017

Related U.S. Application Data

(63) Continuation of application No. PCT/JP2015/006016, filed on Dec. 4, 2015.

(30) Foreign Application Priority Data

Jan. 30, 2015 (JP) .................................. 2015-017193

(51) Int. Cl.
| | |
|---|---|
| *H05K 13/00* | (2006.01) |
| *H05K 13/02* | (2006.01) |
| *H05K 13/04* | (2006.01) |
| *G11B 23/03* | (2006.01) |
| *G11B 17/22* | (2006.01) |

(52) U.S. Cl.
CPC .......... *H05K 13/00* (2013.01); *G11B 17/225* (2013.01); *G11B 23/0323* (2013.01); *H05K 13/021* (2013.01); *H05K 13/0404* (2013.01)

(58) Field of Classification Search
CPC .............. H05K 13/0404; G11B 17/225; G11B 17/053; G11B 23/0323
USPC ................ 198/346.1; 414/277, 222.07, 279; 720/615, 645; 360/69; 369/53.1, 30.03, 369/30.38
See application file for complete search history.

(56) References Cited

U.S. PATENT DOCUMENTS

| | | | | |
|---|---|---|---|---|
| 3,554,390 A | * | 1/1971 | Saul ..................... | B65G 1/0421 414/273 |
| 4,082,194 A | * | 4/1978 | Sheehan ................ | B65G 57/22 414/792 |

(Continued)

FOREIGN PATENT DOCUMENTS

| | | |
|---|---|---|
| JP | 11-162054 | 6/1999 |
| JP | 11-203754 | 7/1999 |

(Continued)

OTHER PUBLICATIONS

International Search Report (ISR) dated Feb. 16, 2016 in International Application No. PCT/JP2015/006016.

*Primary Examiner* — Joseph A Dillon, Jr.

(74) *Attorney, Agent, or Firm* — Wenderoth, Lind & Ponack, L.L.P.

(57) ABSTRACT

A conveyance robot apparatus includes modules positioned in a row; a robot for conveying each of the modules and loading and unloading a magazine tray from one of the modules; a pinion mounted on the robot; racks that are slidably supported on the modules and can mesh with the pinion; and a rack connecting mechanism for connecting adjacent racks to each other.

5 Claims, 37 Drawing Sheets

(56) References Cited

U.S. PATENT DOCUMENTS

| | | | | |
|---|---|---|---|---|
| 4,199,050 A * | 4/1980 | Moller | B65B 21/20 | 198/429 |
| 4,311,265 A * | 1/1982 | Kondo | B23K 3/0676 | 198/346.3 |
| 4,966,513 A * | 10/1990 | Motoda | B65G 1/02 | 414/277 |
| 4,983,095 A * | 1/1991 | Chiappe | B65G 47/514 | 414/267 |
| 5,128,912 A * | 7/1992 | Hug | G11B 17/225 | 360/99.02 |
| 5,136,971 A * | 8/1992 | Blankemeyer | B05B 13/0235 | 118/324 |
| 5,193,970 A * | 3/1993 | Chiappe | B65G 47/514 | 414/416.05 |
| 5,535,572 A * | 7/1996 | Morantz | B65B 11/025 | 53/139.7 |
| 5,544,147 A * | 8/1996 | Koizumi | G11B 17/056 | 369/30.85 |
| 5,818,723 A * | 10/1998 | Dimitri | G11B 17/223 | 700/214 |
| 6,036,510 A * | 3/2000 | Ono | H01R 13/62922 | 439/152 |
| 6,136,270 A * | 10/2000 | Maes | B01L 3/50 | 422/562 |
| 6,160,677 A | 12/2000 | Chiba | | |
| 6,493,604 B1 * | 12/2002 | Kappel | G11B 15/6835 | 700/213 |
| 6,574,063 B1 | 6/2003 | Sasaki et al. | | |
| 7,054,086 B2 * | 5/2006 | Masuda | G11B 15/6835 | 360/55 |
| 7,125,216 B2 * | 10/2006 | Grewe | B26D 7/0675 | 198/419.2 |
| 7,158,326 B2 * | 1/2007 | Hanagata | G11B 15/6835 | 360/69 |
| 7,347,312 B2 * | 3/2008 | Han | B65G 49/064 | 198/346.2 |
| 7,480,118 B2 * | 1/2009 | Ojima | G11B 15/6835 | 360/92.1 |
| 7,630,165 B2 * | 12/2009 | Nave | G11B 15/689 | 360/92.1 |
| 7,676,278 B2 * | 3/2010 | Sasaki | G11B 15/689 | 369/30.27 |
| 7,753,638 B2 * | 7/2010 | Ishiyama | G11B 17/225 | 414/277 |
| 7,777,986 B2 * | 8/2010 | Barkley | G11B 17/225 | 360/92.1 |
| 7,891,264 B2 * | 2/2011 | Wada | B41J 19/00 | 347/37 |
| 8,213,108 B2 * | 7/2012 | Noguchi | G11B 17/221 | 360/92.1 |
| 8,782,677 B2 * | 7/2014 | Yoshida | G11B 17/22 | 720/615 |
| 8,843,946 B2 * | 9/2014 | Nishi | G11B 17/053 | 369/30.52 |
| 8,863,160 B2 * | 10/2014 | Chihara | G11B 17/053 | 369/30.55 |
| 8,869,368 B2 * | 10/2014 | Suzuki | G11B 15/6835 | 29/426.5 |
| 8,873,356 B2 * | 10/2014 | Yamazaki | G11B 17/221 | 369/30.78 |
| 8,875,907 B2 * | 11/2014 | Suzuki | G11B 15/6835 | 211/26 |
| 8,881,184 B2 * | 11/2014 | Yoshida | G11B 17/22 | 720/612 |
| 8,898,683 B2 * | 11/2014 | Higaki | G11B 17/225 | 369/30.85 |
| 8,904,413 B2 * | 12/2014 | Maeda | G11B 23/0323 | 369/30.54 |
| 8,905,223 B2 * | 12/2014 | Ichihara | B65G 21/20 | 198/346.3 |
| 9,033,131 B2 * | 5/2015 | Lee | B23Q 7/04 | 198/346.3 |
| 9,058,848 B2 * | 6/2015 | Nishi | G11B 23/0323 | |
| 9,123,378 B2 * | 9/2015 | Akiyama | G11B 15/6835 | |
| 9,123,379 B2 * | 9/2015 | Higaki | G11B 23/0323 | |
| 9,159,357 B2 * | 10/2015 | Thompson | G11B 15/6835 | |
| 9,165,592 B2 * | 10/2015 | Yoshida | G11B 23/0323 | |
| 9,227,797 B2 * | 1/2016 | Yang | B66F 9/07 | |
| 9,390,747 B2 * | 7/2016 | Yoshida | G11B 23/0323 | |
| 9,613,649 B1 * | 4/2017 | Shimoda | G11B 17/225 | |
| 9,715,894 B2 * | 7/2017 | Ostwald | G11B 15/6835 | |
| 9,959,901 B1 * | 5/2018 | Miyashita | G11B 20/1816 | |
| 9,990,954 B2 * | 6/2018 | Sekine | G11B 17/221 | |
| 2003/0099056 A1 | 5/2003 | Suzuki | | |
| 2004/0212911 A1 * | 10/2004 | Shimanuki | G11B 15/6885 | 360/69 |
| 2004/0258507 A1 * | 12/2004 | Coffin | G11B 15/6835 | 414/277 |
| 2005/0057847 A1 * | 3/2005 | Armagost | G11B 15/6835 | 360/92.1 |
| 2005/0162772 A1 * | 7/2005 | Masuda | G11B 15/6835 | 360/69 |
| 2005/0162775 A1 * | 7/2005 | Ojima | G11B 15/6835 | 360/92.1 |
| 2005/0243678 A1 * | 11/2005 | Shime | G11B 7/08529 | 369/59.12 |
| 2006/0262447 A1 * | 11/2006 | Hoshino | G11B 15/6835 | 360/69 |
| 2007/0131630 A1 * | 6/2007 | Thorn | G11B 15/6825 | 211/41.12 |
| 2010/0097718 A1 | 4/2010 | Wada et al. | | |
| 2011/0144799 A1 * | 6/2011 | Toshima | H01L 21/67706 | 700/230 |
| 2011/0273794 A1 * | 11/2011 | Hori | G11B 15/6835 | 360/92.1 |
| 2012/0255833 A1 * | 10/2012 | Ryu | B23Q 7/1431 | 198/465.1 |
| 2013/0189056 A1 * | 7/2013 | Sudou | G11B 15/6825 | 414/277 |
| 2013/0326548 A1 * | 12/2013 | Chihara | G11B 17/053 | 720/615 |
| 2013/0326549 A1 * | 12/2013 | Nishi | G11B 17/053 | 720/615 |
| 2013/0336098 A1 * | 12/2013 | Yamazaki | G11B 17/221 | 369/30.78 |
| 2013/0347012 A1 * | 12/2013 | Maeda | G11B 23/0323 | 720/610 |
| 2014/0007143 A1 * | 1/2014 | Higaki | G11B 17/056 | 720/613 |
| 2014/0072392 A1 * | 3/2014 | Tanahashi | B65G 1/0421 | 414/277 |
| 2014/0286737 A1 * | 9/2014 | Yang | G11B 15/6835 | 414/277 |
| 2015/0024161 A1 * | 1/2015 | Higaki | G11B 23/0323 | 428/64.2 |
| 2015/0218698 A1 * | 8/2015 | Yoon | C23C 16/04 | 427/255.28 |
| 2015/0323122 A1 * | 11/2015 | Gardner | F16M 11/18 | 254/385 |
| 2016/0354847 A1 * | 12/2016 | Begin | B23D 45/003 | |
| 2017/0194028 A1 * | 7/2017 | Hirose | G11B 23/023 | |
| 2018/0158482 A1 * | 6/2018 | Hirose | G11B 23/023 | |

FOREIGN PATENT DOCUMENTS

| | | |
|---|---|---|
| JP | 2000-90545 | 3/2000 |
| JP | 2001-176169 | 6/2001 |
| JP | 2003-162857 | 6/2003 |
| JP | 2010-102762 | 5/2010 |

\* cited by examiner

CONVEYANCE ROBOT APPARATUS

BACKGROUND

1. Technical Field

This disclosure relates to a conveyance robot apparatus which includes a plurality of modules arranged in a row and a robot which can move each of the modules.

2. Description of Related Art

Conventionally, there has been known a conveyance robot apparatus which includes a plurality of modules arranged in one row and a robot capable of moving each of the modules.

For example, a conveyance robot apparatus disclosed in Unexamined Japanese Patent Publication No. 11-162054 includes a plurality of modules each of which stores a plurality of recording mediums in a state where the modules are arranged in one row. The conveyance robot apparatus also includes a robot which moves in the plurality of modules so as to convey the recording medium stored in the module to a drive mechanism for reproducing the recording medium.

In the case of the conveyance robot apparatus disclosed in Unexamined Japanese Patent Publication No. 11-162054, the robot includes a pinion. The pinion is meshed with a plurality of block-shaped racks arranged in a row in a state where the racks are brought into contact with each other so as to pass through the plurality of modules. The block-shaped racks are inserted into a rail which is mounted on each module and has a C-shaped cross section so that the racks are arranged in one row in a state where the racks are in contact with each other. As a result, the pinion of the robot can be smoothly rolled over the plurality of racks.

In the conveyance robot apparatus disclosed in Unexamined Japanese Patent Publication No. 11-162054, it is necessary to mount the plurality of racks on the rail of each module one by one. Accordingly, it takes time to construct the conveyance robot apparatus formed of the plurality of modules and the robot which moves these modules.

In the conveyance robot apparatus disclosed in Unexamined Japanese Patent Publication No. 11-162054, when a configuration of the conveyance robot apparatus is changed, for example, when an arbitrary module disposed at the center of the plurality of modules arranged in one row is to be exchanged or replaced with another new module, it is necessary to remove the plurality of racks from the rail one by one for reaching the module to be exchanged. Further, it is also necessary to mount the plurality of racks on the rail again after the module is exchanged. Accordingly, it takes time also to change the configuration of the conveyance robot apparatus.

SUMMARY

It is an object of the present disclosure to provide a conveyance robot apparatus including a plurality of modules and a robot capable of moving each of these modules, wherein construction and configuration change of the conveyance robot apparatus can be performed in a short time.

To achieve the object, the conveyance robot apparatus according to this disclosure includes: a plurality of modules arranged in a row in a first direction; a robot capable of moving each of the plurality of modules in the first direction; a pinion mounted on the robot; a plurality of racks which are respectively supported on the plurality of modules in a slidable manner in the first direction, are meshable with the pinion, and are arranged in a row in the first direction; and a rack connecting mechanism configured to connect adjacent racks each other with respect to the plurality of racks arranged in a row in the first direction, by making at least one of the racks positioned at one terminal end slide toward at least one of the racks positioned at another terminal end.

According to this disclosure, in the conveyance robot apparatus which includes the plurality of modules and the robot capable of moving each of these modules, the construction and configuration change of the conveyance robot apparatus can be performed in a short time.

DETAILED DESCRIPTION

An exemplary embodiment will be described herein in detail with reference to the drawings appropriately. However, detailed descriptions more than necessary might be sometimes omitted. For example, in some cases, detailed description of already well-known items and repeated description with respect to substantially the same configuration will be omitted. These omissions are made to avoid unnecessary redundancy of the following description and to facilitate the understanding of those skilled in the art.

Note that the attached drawings and the following description are provided for those skilled in the art to fully understand the present disclosure, and are not intended to limit the subject matter as described in the appended claims.

Exemplary Embodiment

Hereinafter, an exemplary embodiment of this disclosure will be described with reference to the drawings.

Figure 1:
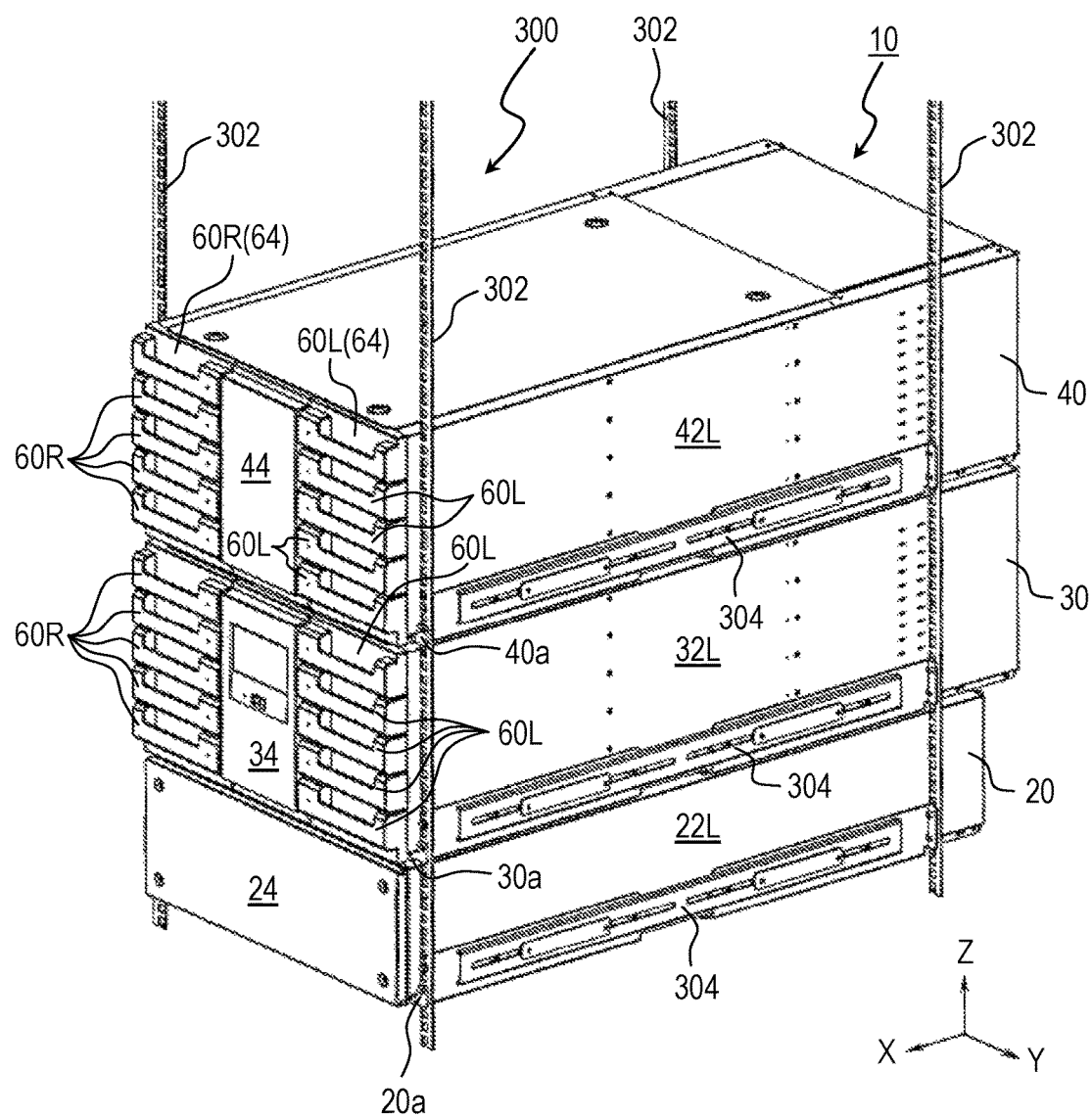
FIG. 1 is a perspective view of a conveyance robot apparatus according to an exemplary embodiment.

FIG. 1 is a perspective view of a conveyance robot apparatus according to this exemplary embodiment. To facilitate the understanding of this disclosure, an X-Y-Z coordinate system is defined. An X axis direction is a front-back direction of conveyance robot apparatus 10. A Y axis direction is a width direction of conveyance robot apparatus 10. A Z axis direction is a vertical direction of conveyance robot apparatus 10.

As shown in FIG. 1, conveyance robot apparatus 10 according to this exemplary embodiment includes bottom module 20, main module 30, and extension module 40 each of which has a substantially rectangular parallelepiped shape.

Conveyance robot apparatus 10 shown in FIG. 1 includes three modules consisting of bottom module 20, main module 30, and extension module 40. However, it is sufficient for conveyance robot apparatus 10 according to this exemplary embodiment to include at least two modules, and the number of modules is not limited.

Conveyance robot apparatus 10 is used in a state where conveyance robot apparatus 10 is mounted on rack frame 300 of a 19-inch rack, for example.

Rack frame 300 includes: four main frames 302 extending in the Z axis direction; and a plurality of side frames 304 extending in the X axis direction, and having both ends thereof fixed to main frames 302 respectively.

Figure 2:
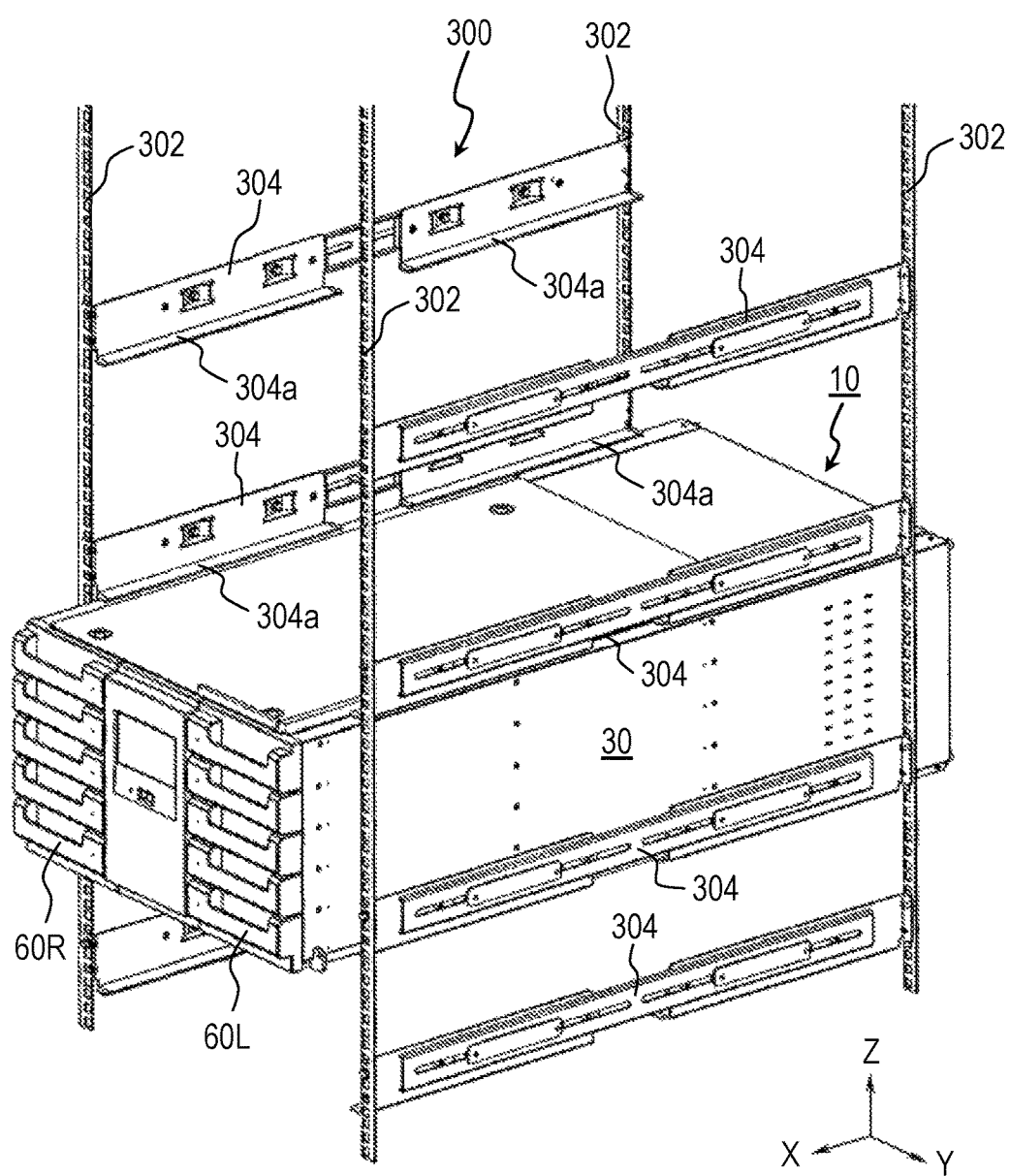
FIG. 2 is a view for describing a method for mounting a module of the conveyance robot apparatus according to the exemplary embodiment on a rack frame.

FIG. 2 is a view for describing a method for mounting the module of conveyance robot apparatus 10 on rack frame 300. As shown in FIG. 2, side frames 304 of rack frame 300 include module support portions 304a which project toward an inner side of rack frame 300 in the Y axis direction, and on which bottom module 20, main module 30, and extension module 40 of conveyance robot apparatus 10 are mounted. With module support portions 304a, each of bottom module 20, main module 30, and extension module 40 of conveyance robot apparatus 10 is supported on side frames 304 of rack frame 300 in a slidable manner in the X axis direction.

As shown in FIG. 1, bottom module 20, main module 30, and extension module 40 of conveyance robot apparatus 10 respectively include fixing tabs 20a, 30a, and 40a which are fixed to main frames 302 of rack frame 300.

Figure 3:
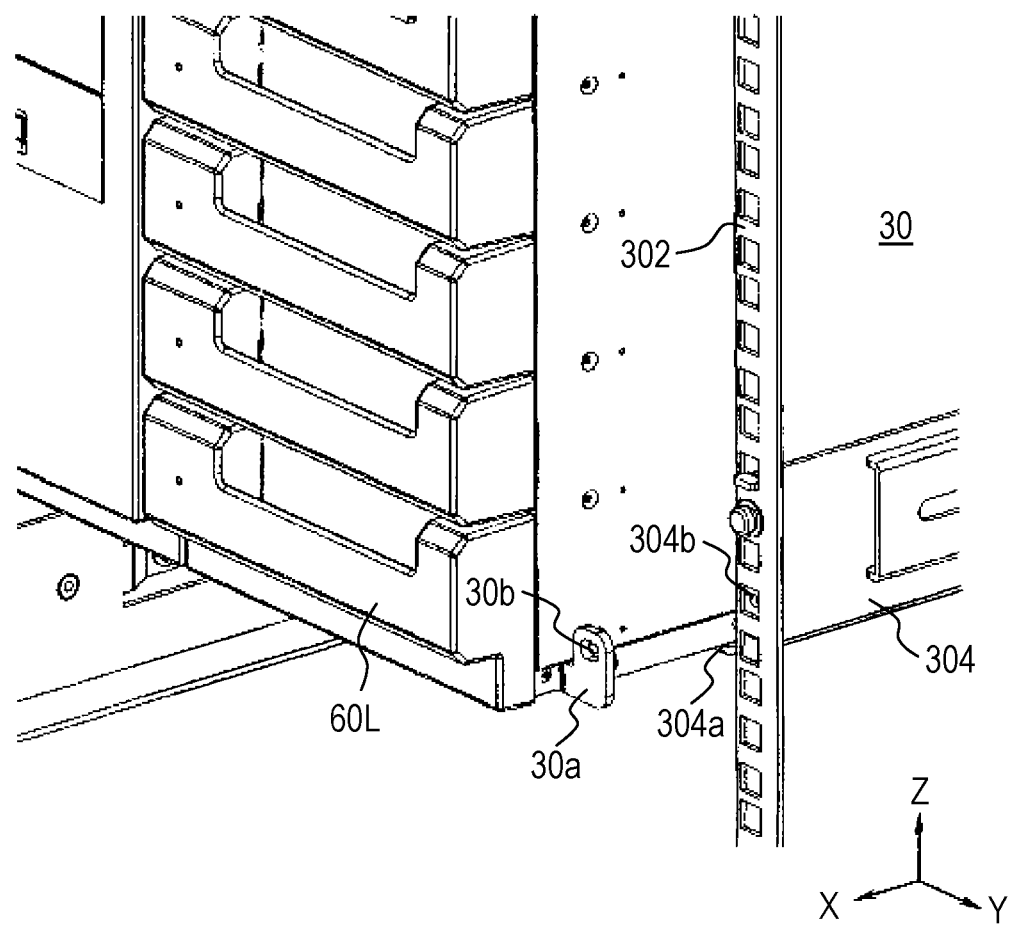
FIG. 3 is a view showing a state of a fixing tab of a main module immediately before the main module is fixed to the rack frame in the conveyance robot apparatus according to the exemplary embodiment.

FIG. 3 is a view showing a state of the fixing tab of main module 30 immediately before main module 30 is fixed to rack frame 300 in conveyance robot apparatus 10 according to the exemplary embodiment. As shown in FIG. 3, for example, fixing tab 30a of main module 30 has through hole 30b. A bolt not shown in the drawing which is made to pass through hole 30b is engaged with female threaded hole 304b formed in side frame 304 so that fixing tab 30a is fixed to main frame 302.

Bottom module 20, main module 30, and extension module 40 of conveyance robot apparatus 10 are mounted on rack frame 300, and then are arranged in a row in the Z axis direction.

As shown in FIG. 1, bottom module 20 includes left side panel 22L and front panel 24. Main module 30 includes left side panel 32L and front panel 34. Extension module 40 includes left side panel 42L and front panel 44.

In FIG. 1, magazine units 60L, 60R are detachably mounted on each of main module 30 and extension module 40.

Figure 4:
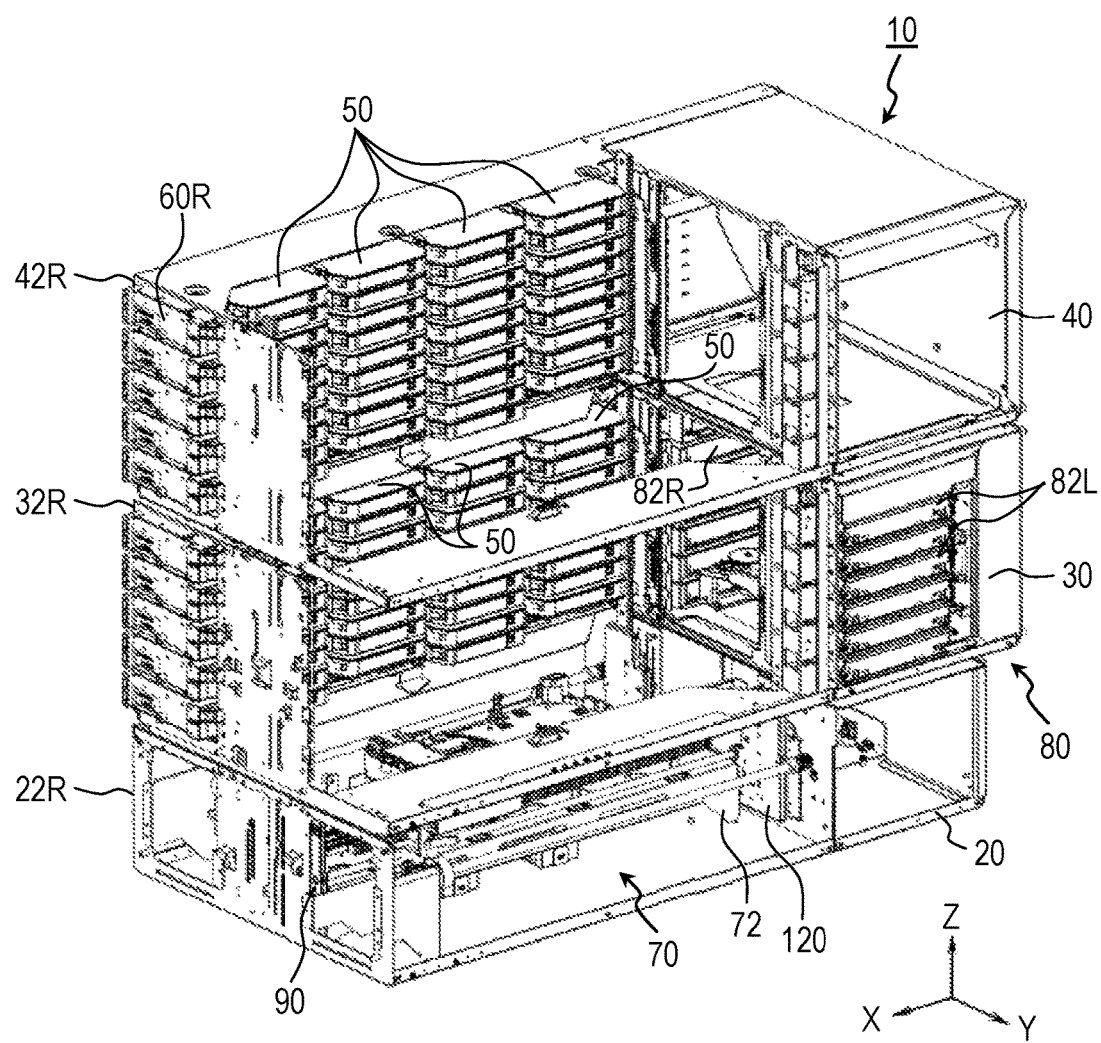
FIG. 4 is a view showing the inside of the conveyance robot apparatus according to the exemplary embodiment.

FIG. 4 shows the inside of conveyance robot apparatus 10 according to the exemplary embodiment. FIG. 4 shows a state where left side panels 22L, 32L, 42L and front panels 24, 34, 44 are respectively removed from bottom module 20, main module 30, and extension module 40.

In FIG. 4, magazine units 60L are removed from each of main module 30 and extension module 40.

As shown in FIG. 4, each of main module 30 and extension module 40 stores a plurality of magazines 50. Each of magazines accommodates a plurality of discs. That is, each of main module 30 and extension module 40 is a disc storage module for storing a plurality of discs.

In this exemplary embodiment, the plurality of magazines 50 are arranged in a matrix array along right side panel 32R of main module 30 and right side panel 42R of extension module 40. Although not shown in the drawing, the plurality of magazines 50 are arranged in a matrix array also along left side panel 32L of main module 30 and left side panel 42L of extension module 40.

In this exemplary embodiment, each of main module 30 and extension module 40 can store eighty magazines 50 at maximum. Specifically, main module 30 can store forty magazines 50 on each of a left side panel 32L side and a right side panel 32R side, and extension module 40 can store forty magazines 50 on each of a left side panel 42L side and a right side panel 42R side. Along left side panel 32L, 42L and right side panel 32R, 42R, ten magazines 50 are arranged in a row in the Z axis direction, and four magazines 50 are arranged in a row in the X axis direction.

Figure 5:
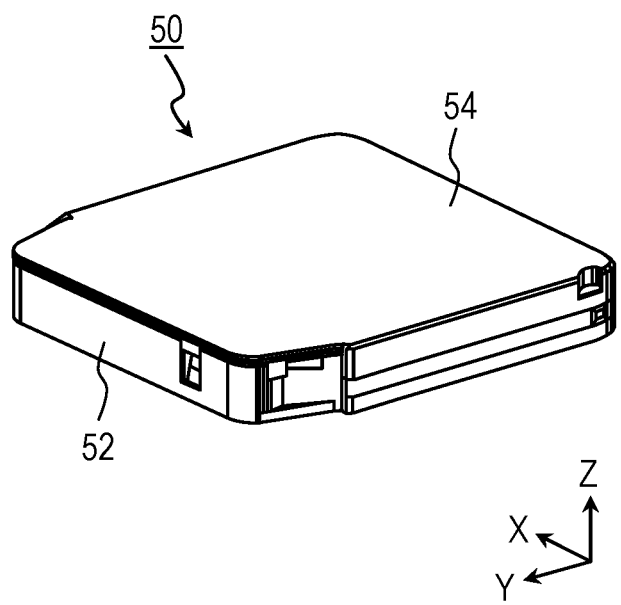
FIG. 5 is a perspective view of a magazine which accommodates a plurality of discs according to the exemplary embodiment.
Figure 6:
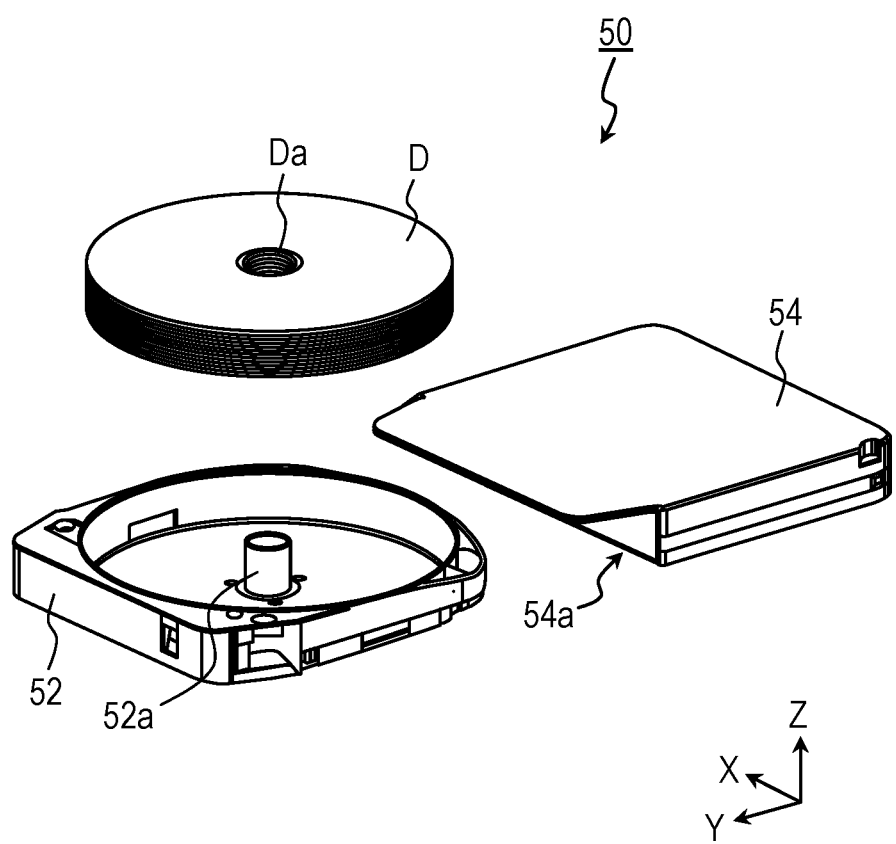
FIG. 6 is an exploded view of the magazine shown in FIG. 5.

FIG. 5 is a perspective view of one magazine 50 which accommodates a plurality of discs according to the exemplary embodiment, and FIG. 6 is an exploded view of magazine 50. In this exemplary embodiment, as shown in FIG. 5, magazine 50 includes magazine tray 52 and magazine case 54.

As shown in FIG. 6, magazine tray 52 of magazine 50 accommodates a plurality of discs D such that discs D can be taken out in the Z axis direction which is a thickness direction of the discs. Magazine tray 52 accommodates the plurality of discs D in a state where discs D are made to overlap with each other in the thickness direction of discs D. Magazine tray 52 has support pin portion 52a which is made to pass through center hole Da of the plurality of discs D.

As shown in FIG. 6, magazine case 54 of magazine 50 stores magazine tray 52 such that magazine tray 52 can be taken out in the Y axis direction. Accordingly, magazine case 54 has opening 54a which allows magazine tray 52 to pass therethrough.

As shown in FIG. 1 and FIG. 4, magazine units 60L, 60R are detachably mounted on each of main module 30 and extension module 40. Magazine units 60L are arranged on a left side of main module 30 and extension module 40, and magazine units 60R are arranged on a right side of main module 30 and extension module 40. Magazine units 60L, 60R are in left-right symmetry.

Figure 7:
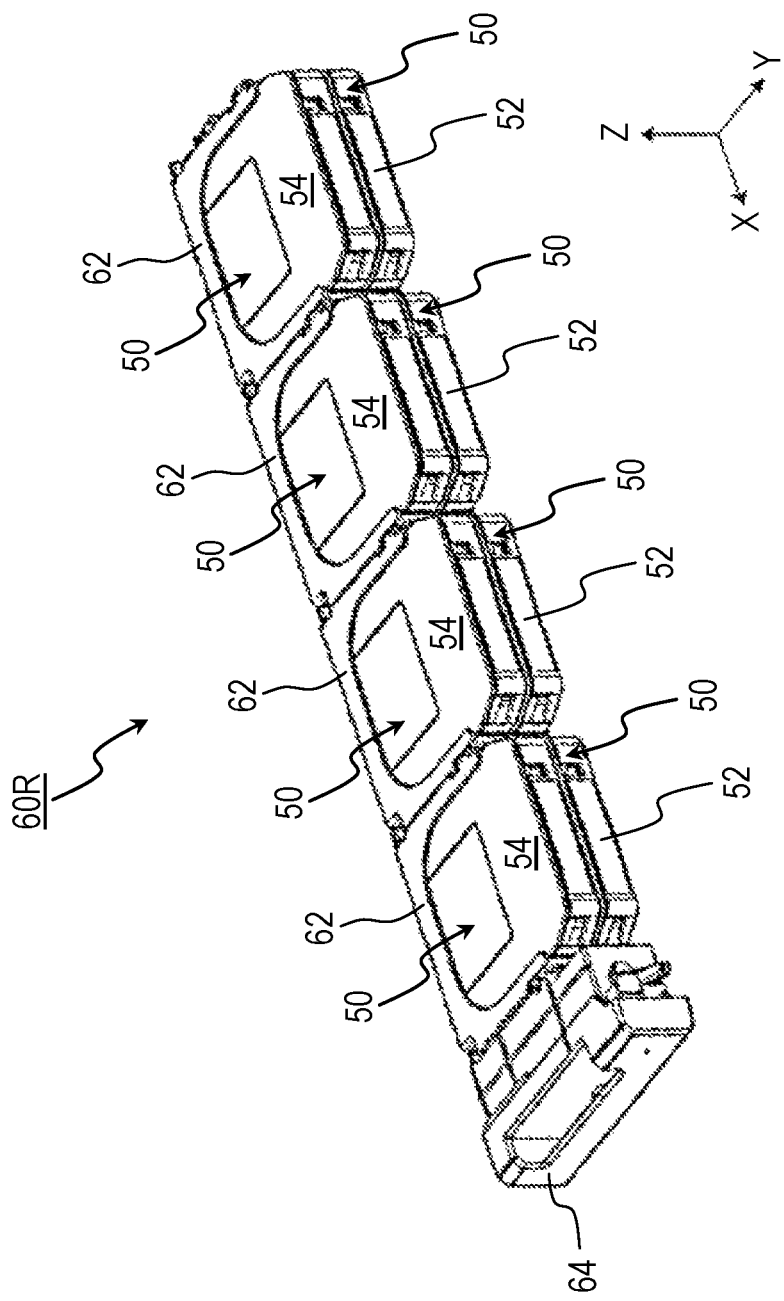
FIG. 7 is a perspective view of a magazine unit according to the exemplary embodiment.

FIG. 7 is a perspective view of magazine unit 60R according to the exemplary embodiment. As shown in FIG. 7, magazine unit 60R includes a plurality of magazine holding portions 62 each of which detachably holds magazine 50, and front panel portion 64 which a user grips when magazine unit 60R is removed from conveyance robot apparatus 10.

Although not shown in the drawing, magazine unit 60L also includes magazine holding portions 62 and front panel portion 64 in the same manner.

In magazine unit 60L, 60R, magazine 50 is detachably mounted on each of the plurality of magazine holding portions 62 so that magazine unit 60L, 60R holds the plurality of magazines 50. In this exemplary embodiment, each of magazine units 60L, 60R can hold eight magazines 50 at maximum. For example, magazine unit 60L, 60R can hold two magazines 50 in the Z axis direction and four magazines 50 in the X axis direction. In FIG. 7, magazine unit 60R holds eight magazines 50.

As shown in FIG. 7, each magazine holding portion 62 of magazine unit 60R holds magazine case 54 such that magazine tray 52 can be taken out from magazine case 54 of magazine 50. Magazine unit 60L also has substantially the same configuration as magazine unit 60R.

As shown in FIG. 4 and FIG. 7, in this exemplary embodiment, magazine units 60L, 60R are arranged along left side panel 32L and right side panel 32R of main module 30 and left side panel 42L and right side panel 42R of extension module 40, respectively. From each magazine 50 held by magazine units 60L, 60R, magazine tray 52 is taken out toward a center portion of main module 30 and a center portion of extension module 40 in the Y axis direction which is the width direction of conveyance robot apparatus 10.

Although the detailed description is made later, magazine carrier unit 70 moves in the Z axis direction along the center portion of main module 30 and the center portion of extension module 40 in the Y axis direction. Magazine carrier unit 70 takes out magazine tray 52 of magazine 50 from magazine 50 held by magazine unit 60L, 60R.

Magazine units 60L, 60R are detachable from main module 30 and extension module 40 in the X axis direction. As shown in FIG. 1, when magazine units 60L, 60R are mounted on main module 30 and extension module 40, front panel portions 64 of magazine units 60L, 60R form a decorative surface of conveyance robot apparatus 10 in cooperation with front panels 34, 44 of main module 30 and extension module 40. When a user grips front panel portion 64 of magazine unit 60L, 60R and removes magazine unit 60L, 60R from main module 30 or extension module 40, magazine 50 can be mounted on or removed from magazine unit 60L, 60R.

Figure 8:
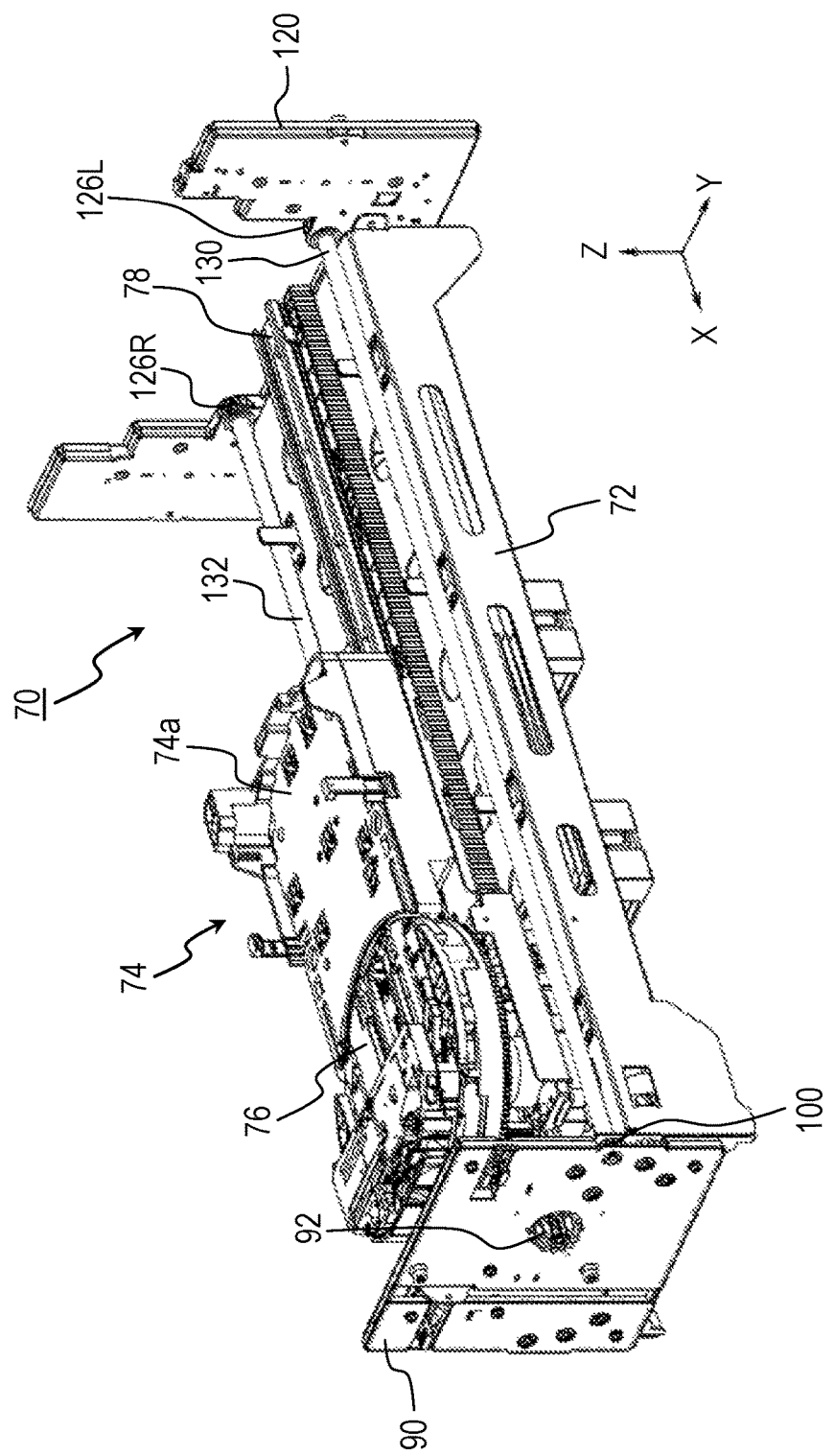
FIG. 8 is a perspective view of a magazine carrier unit according to the exemplary embodiment.

FIG. 8 is a perspective view of magazine carrier unit 70 according to the exemplary embodiment.

Magazine carrier unit 70 shown in FIG. 8 faces magazines 50 with a distance which allows magazine carrier unit 70 to move in the Z axis direction between magazine carrier unit 70 and magazines 50 in conveyance robot apparatus 10, and magazines 50 are held by magazine units 60L, 60R mounted on main module 30 and extension module 40. Magazine carrier unit 70 takes out magazine tray 52 from magazine 50, and conveys magazine tray 52 taken out from magazine 50. That is, magazine carrier unit 70 functions as a disc conveying robot which conveys discs D.

Specifically, magazine carrier unit 70 includes: base portion 72 which can pass through the inside of bottom module 20, main module 30, and extension module 40 in the Z axis direction; slider unit 74 which is mounted on base portion 72 in a movable manner in the X axis direction; and magazine picker unit 76 which is mounted on slider unit 74 and takes out and holds magazine tray 52 from magazine 50.

Base portion 72 of magazine carrier unit 70 is movable parallel to the Z axis direction along each center portion of bottom module 20, main module 30, and extension module 40 in the Y axis direction. With such a configuration, magazine picker unit 76 can be positioned with respect to a position in the Z axis direction of arbitrary magazine 50 stored in main module 30 or extension module 40.

Slider unit 74 mounted on base portion 72 of magazine carrier unit 70 moves along guide rail 78 mounted on base portion 72 and extending in the X axis direction. With such a configuration, magazine picker unit 76 can be positioned with respect to a position in the X axis direction of arbitrary magazine 50 stored in main module 30 or extension module 40.

Magazine picker unit 76 mounted on slider unit 74 takes out magazine tray 52 from arbitrary magazine 50 stored in main module 30 or extension module 40. Magazine picker unit 76 is rotatable about a center line of rotation which extends in the Z axis direction. Magazine picker unit 76 rotates in a state where magazine picker unit 76 holds magazine tray 52 taken out from magazine 50, and places magazine tray 52 on tray placement portion 74a of slider unit 74.

In this exemplary embodiment, as shown in FIG. 4, magazine carrier unit 70 stands by in bottom module 20 which is an initial position.

Magazine tray 52 placed on tray placement portion 74a of slider unit 74 by magazine picker unit 76 is conveyed to drive unit 80 shown in FIG. 4. In this exemplary embodiment, drive unit 80 is mounted on a rear side of main module 30.

Figure 9:
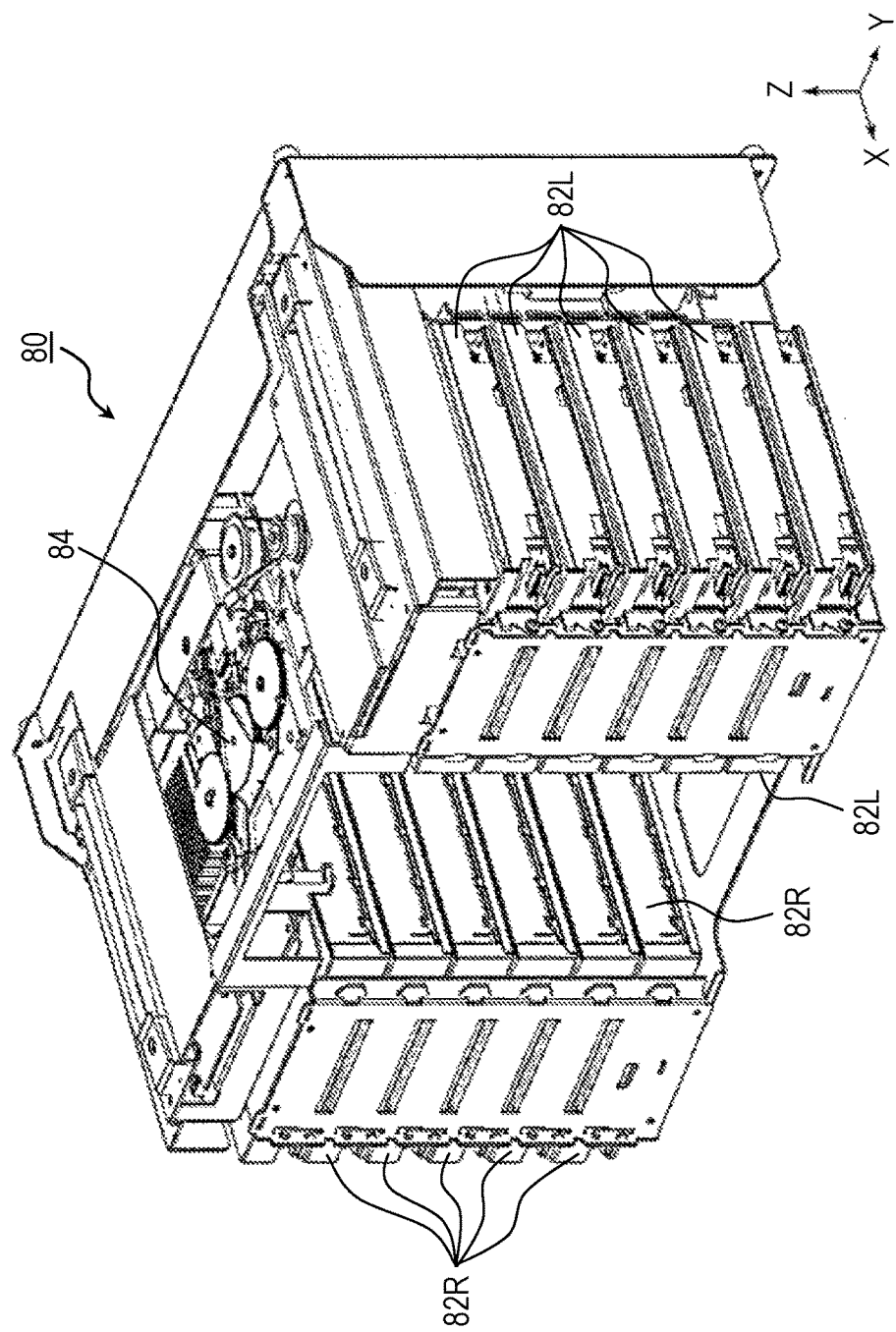
FIG. 9 is a perspective view of a drive unit according to the exemplary embodiment.

FIG. 9 is a perspective view of drive unit 80 according to the exemplary embodiment. As shown in FIG. 9, drive unit 80 includes a plurality of disc drive devices 82L, 82R which reproduce information recorded in disc D or records information in disc D. Each of the plurality of disc drive devices 82L, 82R includes a tray not shown in the drawing which is advanceable and retractable in the Y axis direction, and on which disc D is placed.

Specifically, as shown in FIG. 4, the plurality of disc drive devices 82L are arranged in a row in the Z axis direction on a left side of main module 30 of conveyance robot apparatus 10. On the other hand, the plurality of disc drive devices 82R are arranged in a row in the Z axis direction on a right side of main module 30 of conveyance robot apparatus 10.

Disc drive devices 82L disposed on the left side of main module 30 and disc drive devices 82R disposed on the right side of main module 30 face each other in the Y axis direction with a distance between disc drive devices 82L and disc drive devices 82R. Disc drive devices 82L are disposed on the left side of main module 30 such that the trays are ejected toward disc drive devices 82R disposed on the right side of main module 30. On the other hand, disc drive devices 82R are disposed on the right side of main module 30 such that the trays are ejected toward disc drive devices 82L disposed on the left side of main module 30.

As shown in FIG. 9, drive unit 80 includes disc mount unit 84 which is movable in the Z axis direction between the plurality of disc drive devices 82L arranged in a row in the Z axis direction on the left side in conveyance robot apparatus 10 and the plurality of disc drive devices 82R arranged in a row in the Z axis direction on the right side in conveyance robot apparatus 10.

Disc mount unit 84 takes out the plurality of discs D from magazine tray 52 placed on tray placement portion 74a of slider unit 74 of magazine carrier unit 70, and mounts the plurality of discs D taken out from magazine tray 52 on the trays of the plurality of disc drive devices 82L, 82R.

Specifically, slider unit 74 of magazine carrier unit 70 is moved to the rear side of main module 30. With such a movement of slider unit 74, magazine tray 52 placed on tray placement portion 74a of slider unit 74 is disposed below disc mount unit 84 of drive unit 80.

Disc mount unit 84 of drive unit 80 is lowered toward magazine tray 52, and holds the plurality of discs D accommodated in magazine tray 52. Disc mount unit 84 which holds the plurality of discs D is elevated, and stands by.

Disc D disposed at a lowermost portion among the plurality of discs D held by disc mount unit 84 is mounted on one disc drive device 82L or one disc drive device 82R. A tray of one disc drive device 82L or one disc drive device 82R is ejected, and the tray is disposed below disc mount unit 84. Disc mount unit 84 is lowered toward the tray ejected from disc drive device 82L or disc drive device 82R, and mounts disc D disposed at the lowermost portion on the tray. After disc mount unit 84 mounts corresponding disc D on the tray, disc mount unit 84 is elevated, and the tray on which disc D is mounted is returned to the inside of disc drive device 82L or to the inside of disc drive device 82R. By repeating such operations, each of the plurality of discs D held by disc mount unit 84 is mounted on corresponding disc drive device 82L, 82R.

Next, the description is made with respect to a carrier unit moving mechanism which moves magazine carrier unit 70 shown in FIG. 8 in the Z axis direction.

Magazine carrier unit 70 shown in FIG. 8 moves between the plurality of modules so as to convey magazine tray 52 of magazine 50 in main module 30 or extension module 40, and also so as to stand by in bottom module 20.

The number of modules through which magazine carrier unit 70 moves and passes are determined depending on a use mode of conveyance robot apparatus 10 for a user. For example, as shown in FIG. 4, there is a use mode where magazine carrier unit 70 passes through one bottom module 20, one main module 30 and one extension module 40 which are arranged in a row in the Z axis direction. For example, there is also a use mode where magazine carrier unit 70 passes through one bottom module 20, one main module 30, and the plurality of extension modules 40 which are arranged in a row in the Z axis direction. Accordingly, it is necessary to form conveyance robot apparatus 10 such that magazine carrier unit 70 can pass through a desired number of modules.

To satisfy such requirement, the carrier unit moving mechanism which makes magazine carrier unit 70 pass through the desired number of modules is mounted on conveyance robot apparatus 10.

Specifically, the carrier unit moving mechanism is a rack and pinion mechanism. A pinion is mounted on magazine carrier unit 70, and a rack is mounted on each of bottom module 20, main module 30, and extension module 40. Hereinafter, the carrier unit moving mechanism is specifically described.

First, as shown in FIG. 8, magazine carrier unit 70 includes pinion units 90, 120. Pinion unit 90 is formed of a gear box mounted on a front side of base portion 72 of magazine carrier unit 70, that is, on a front side of conveyance robot apparatus 10. Pinion unit 120 is formed of a gear box mounted on a rear side of base portion 72 of magazine carrier unit 70, that is, on a rear side of conveyance robot apparatus 10.

Figure 10:
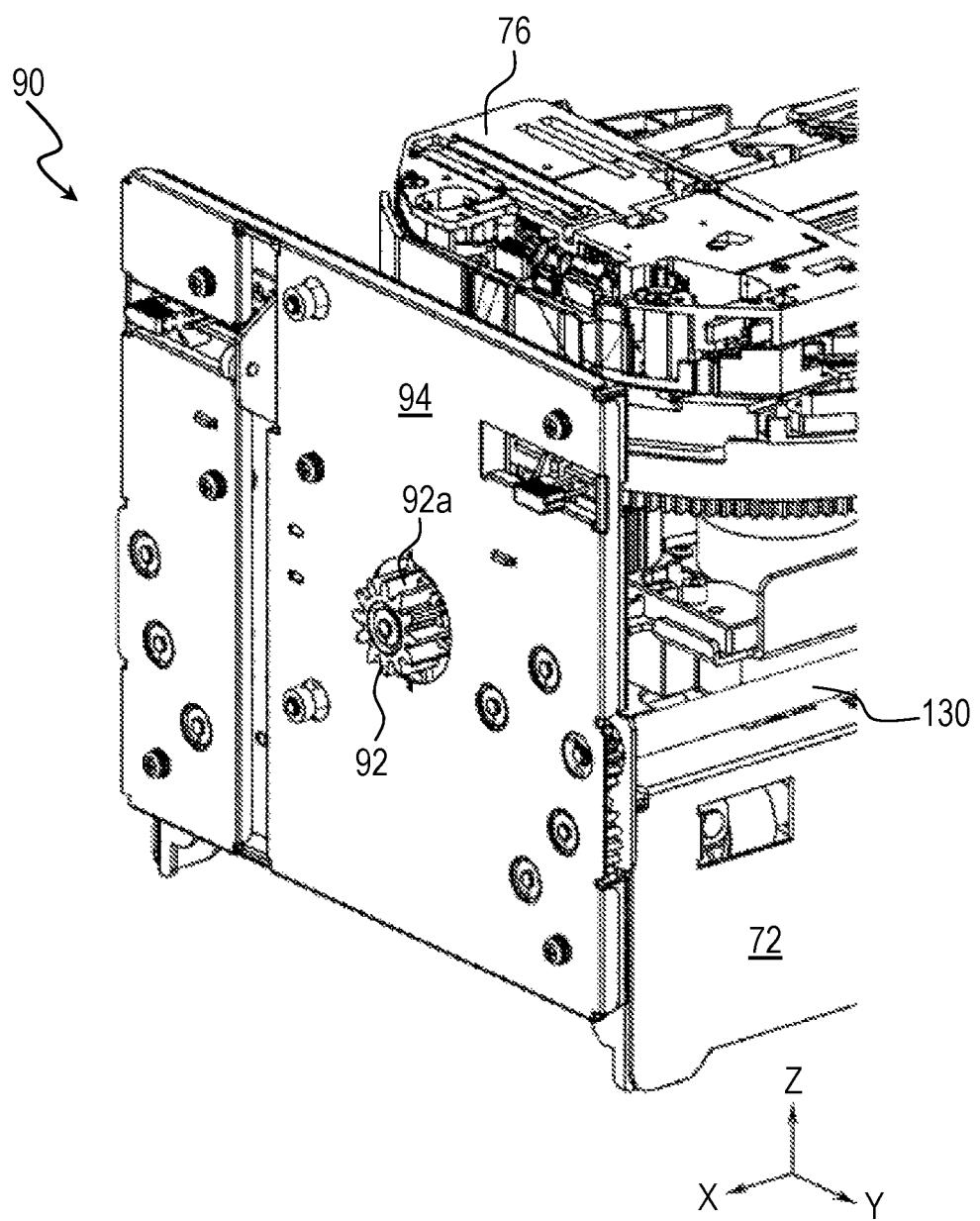
FIG. 10 is a perspective view of a pinion unit mounted on a front side of the magazine carrier unit according to the exemplary embodiment.

FIG. 10 is a perspective view of pinion unit 90 mounted on the front side of magazine carrier unit 70 according to the exemplary embodiment. Front pinion unit 90 includes front pinion 92 forming a part of constitutional elements of the carrier unit moving mechanism.

Figure 11:
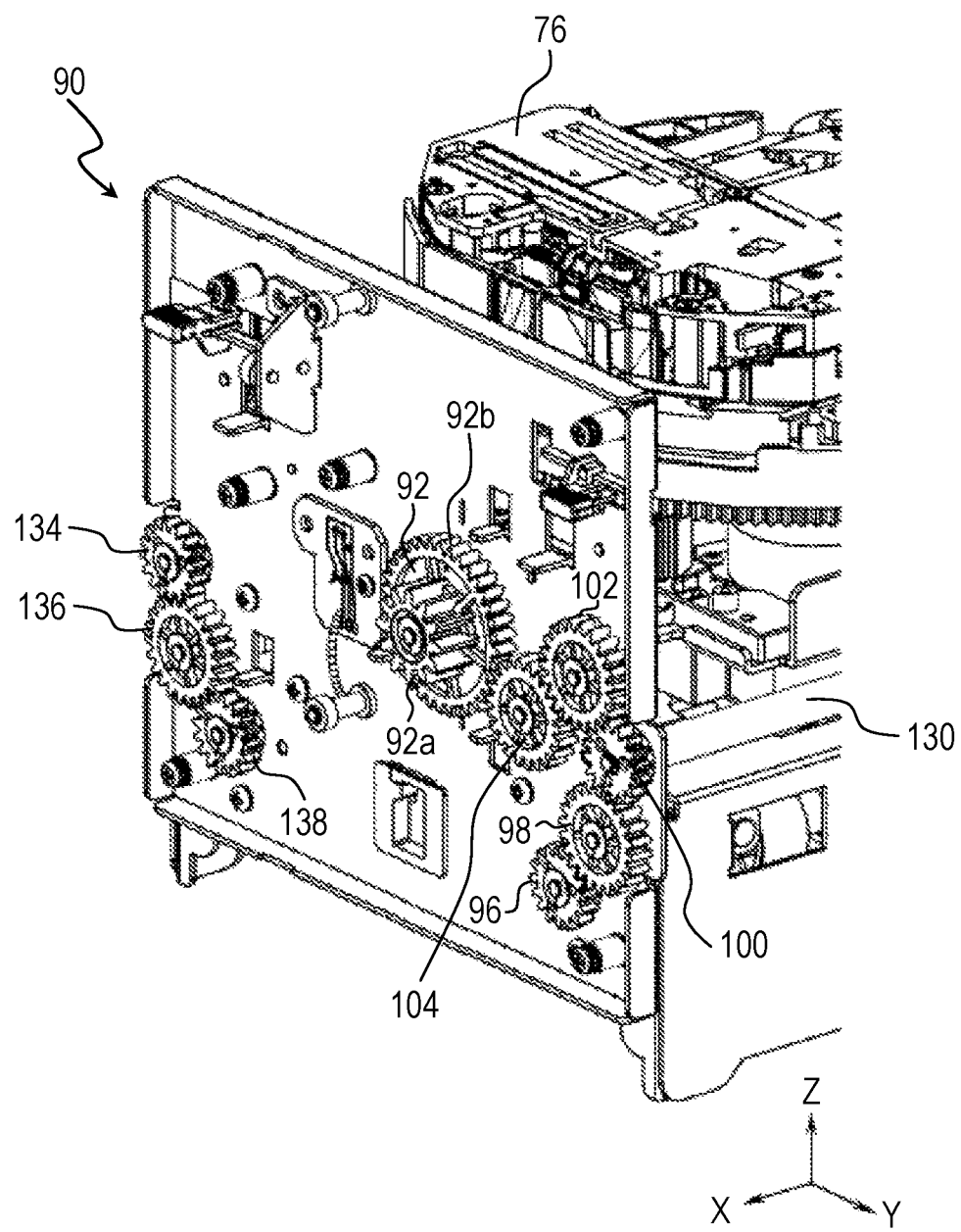
FIG. 11 is an exploded view of the pinion unit mounted on the front side of the magazine carrier unit according to the exemplary embodiment.
Figure 12:
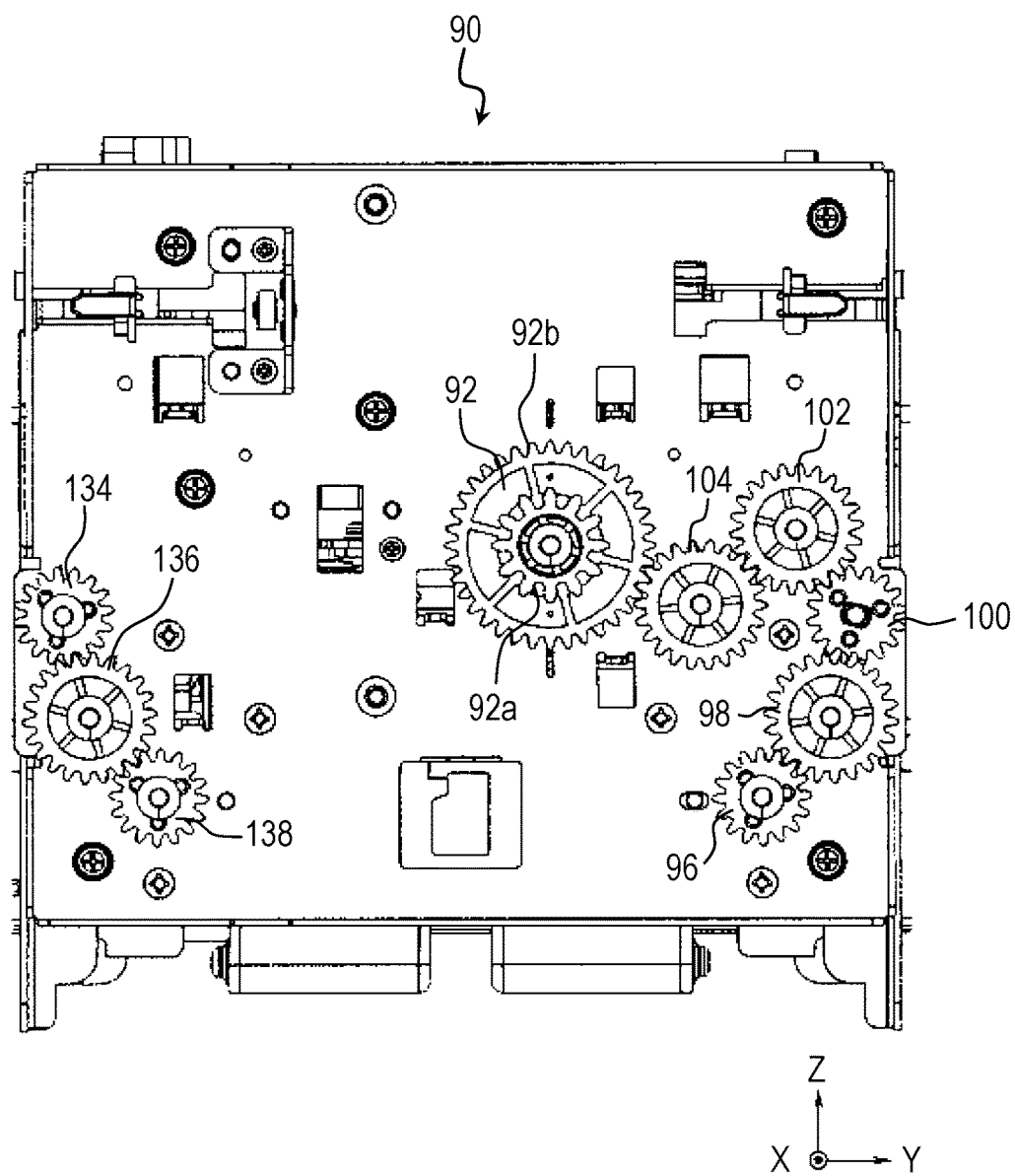
FIG. 12 is a front view of the pinion unit mounted on the front side of the magazine carrier unit according to the exemplary embodiment.

FIG. 11 is an exploded view of pinion unit 90 mounted on the front side of magazine carrier unit 70 according to the exemplary embodiment. Specifically, FIG. 11 shows pinion unit 90 mounted on the front side of magazine carrier unit 70 in a state where gear box cover 94 shown in FIG. 10 is removed. FIG. 12 is a front view of pinion unit 90 mounted on the front side of magazine carrier unit 70 according to the exemplary embodiment in a state where gear box cover 94 is removed.

As shown in FIG. 11 and FIG. 12, front pinion 92 includes: pinion teeth 92a which are meshed with rack teeth of the racks described in detail later of bottom module 20, main module 30, and extension module 40; and gear teeth 92b which are drivingly connected with drive gear 96.

Drive gear 96 is drivingly connected to gear teeth 92b of front pinion 92 by way of a plurality of power transmission gears 98, 100, 102, 104.

Figure 13:
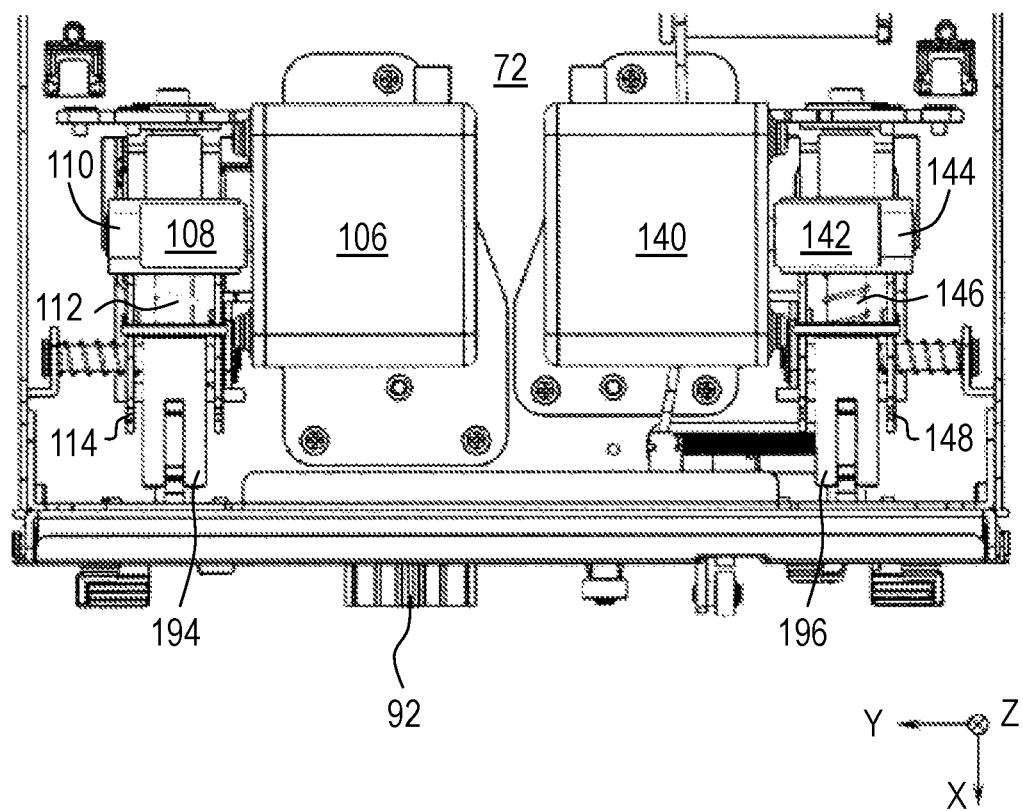
FIG. 13 is a view showing a motor for driving the pinion unit mounted on the front side of the magazine carrier unit according to the exemplary embodiment.

FIG. 13 is a view showing a motor for driving pinion unit 90 mounted on the front side of magazine carrier unit 70 according to the exemplary embodiment. Drive gear 96 is rotatably driven by motor 106 mounted on a back side (a lower side in the Z axis direction) of base portion 72 of magazine carrier unit 70 shown in FIG. 13. Specifically, drive gear 96 is rotatably driven by motor 106 by way of worm 108 mounted on motor 106, worm wheel 110 meshed with worm 108, and power transmission shaft 112 which transmits power of motor 106 from worm wheel 110 to drive gear 96. Although the detailed description is made later, a drive connection between drive gear 96 and power transmission shaft 112 can be released by clutch lever 114.

Figure 14:
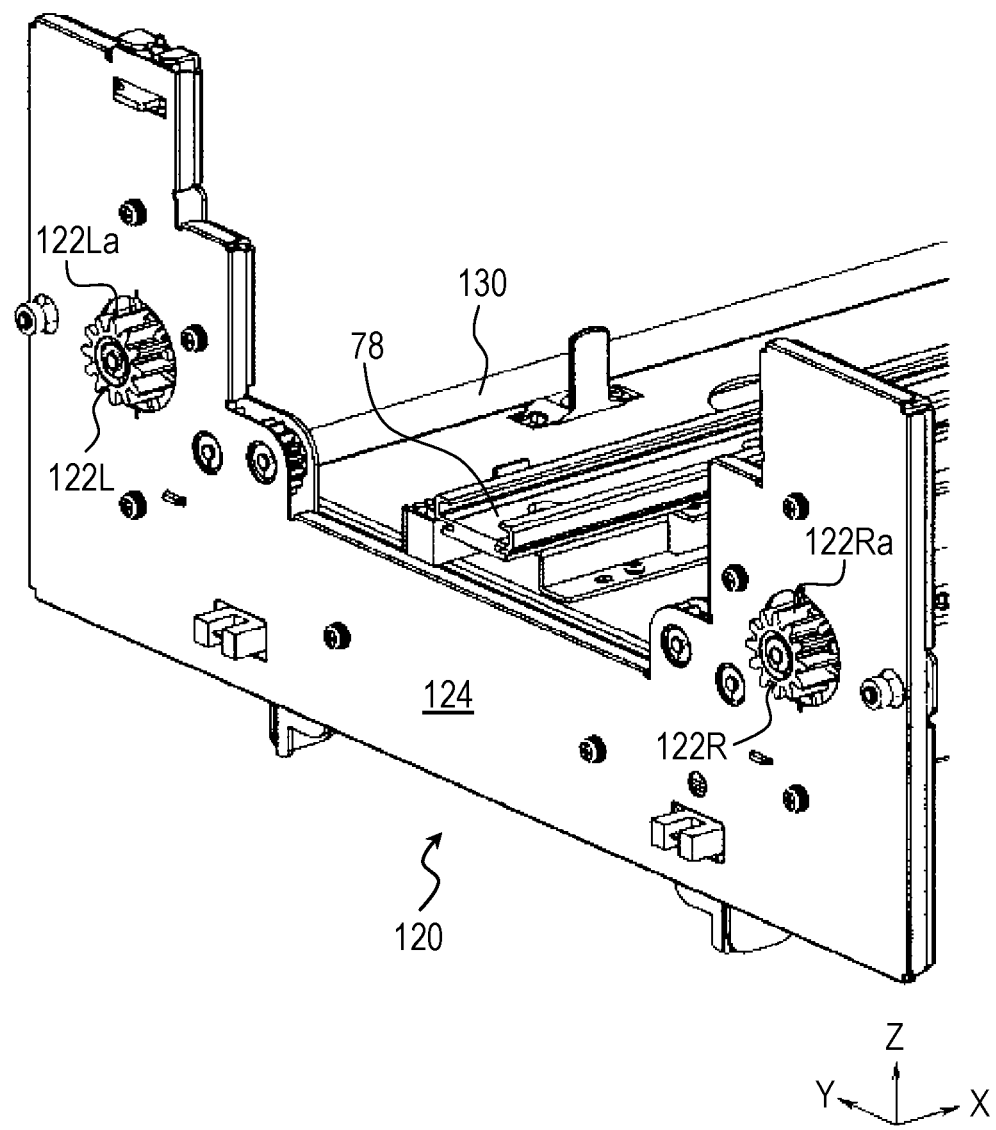
FIG. 14 is a perspective view of a pinion unit mounted on a rear side of the magazine carrier unit according to the exemplary embodiment.

FIG. 14 is a perspective view of the pinion unit mounted on a rear side of the magazine carrier unit according to the exemplary embodiment. In the same manner as front pinion unit 90, rear pinion unit 120 includes rear pinions 122L, 122R forming parts of the constitutional elements of the carrier unit moving mechanism.

Figure 15:
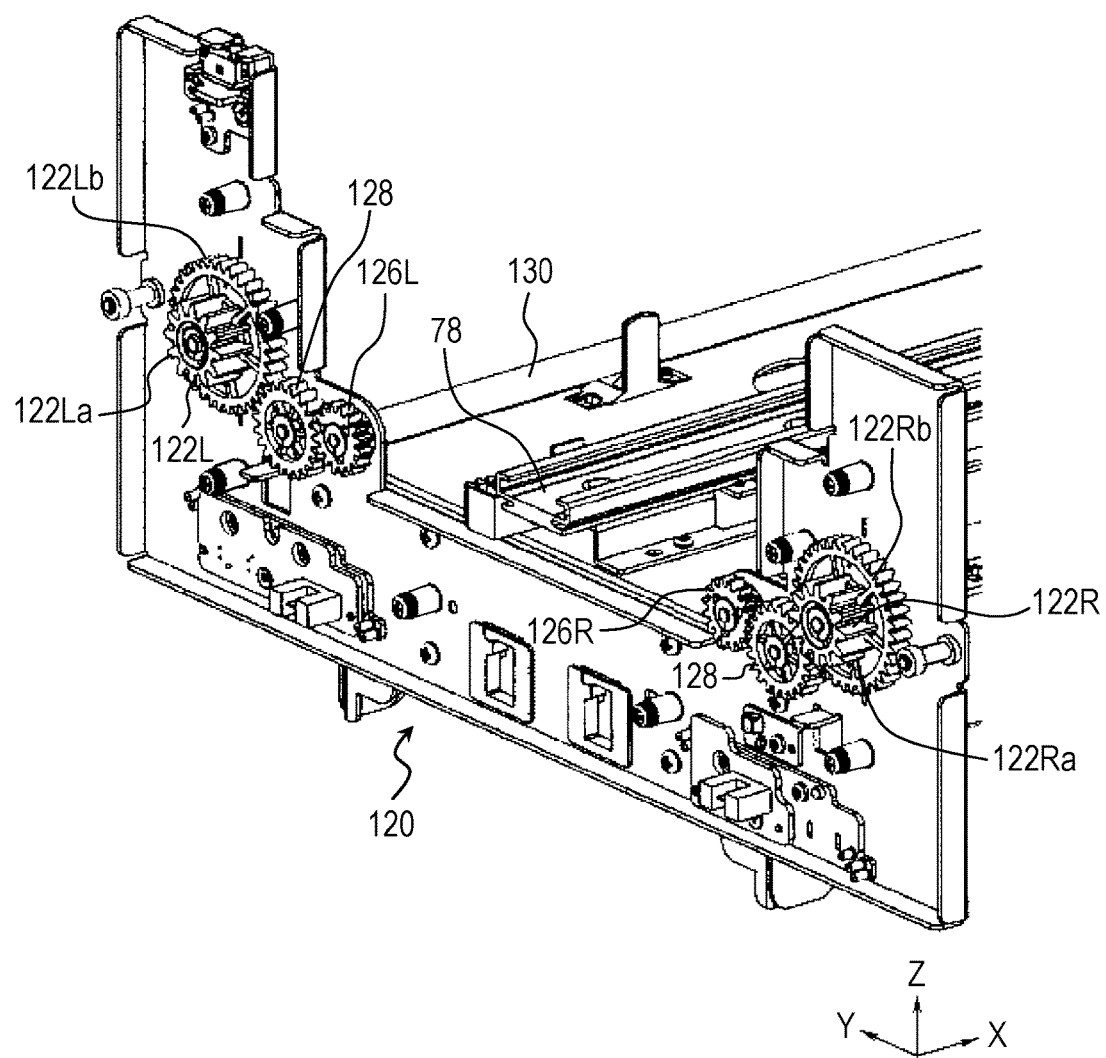
FIG. 15 is an exploded view of the pinion unit mounted on the rear side of the magazine carrier unit according to the exemplary embodiment.
Figure 16:
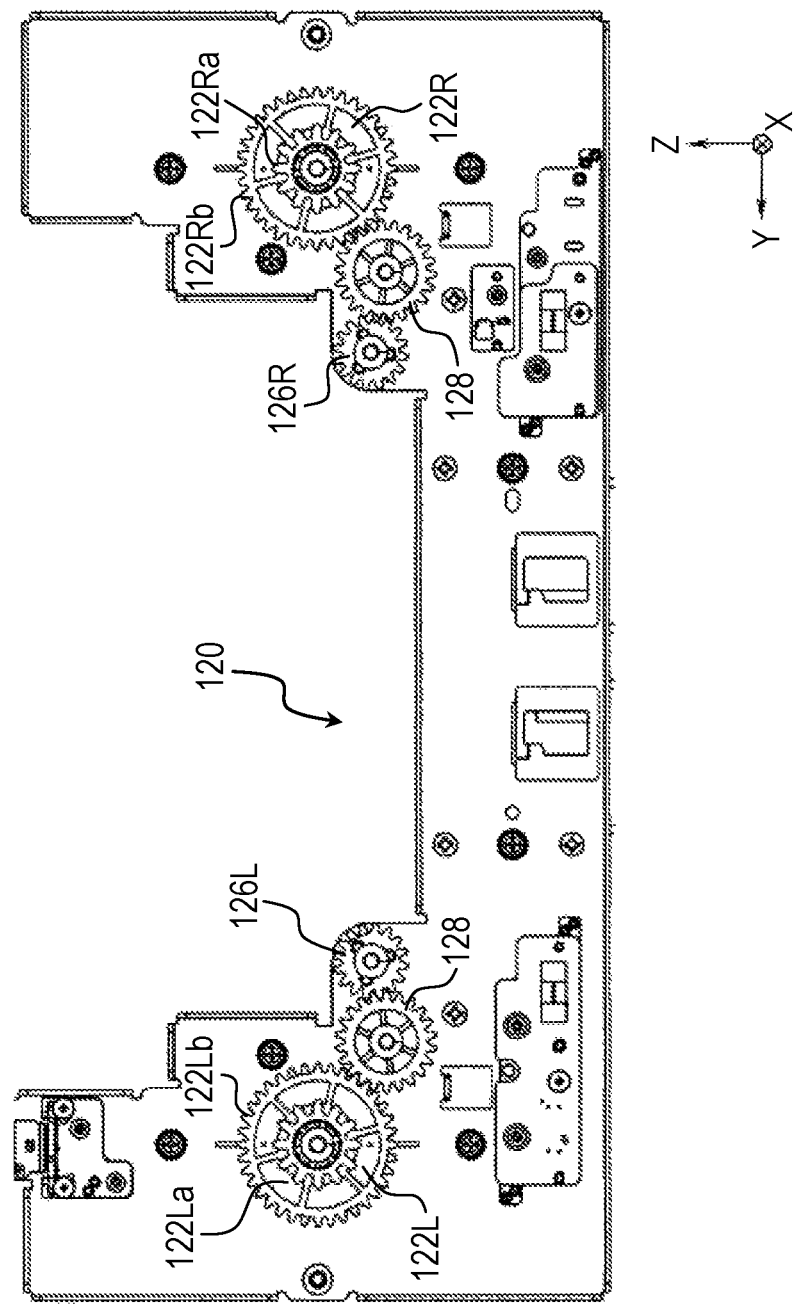
FIG. 16 is a front view of the pinion unit mounted on the rear side of the magazine carrier unit according to the exemplary embodiment.

FIG. 15 is an exploded view of pinion unit 120 mounted on the rear side of the magazine carrier unit according to the exemplary embodiment. Specifically, FIG. 15 shows pinion unit 120 mounted on the rear side of the magazine carrier unit in a state where gear box cover 124 shown in FIG. 14 is removed. FIG. 16 is a front view of pinion unit 120 mounted on the rear side of magazine carrier unit 70 according to the exemplary embodiment in a state where gear box cover 124 is removed.

As shown in FIG. 15 and FIG. 16, rear pinion 122L includes: pinion teeth 122La which are meshed with rack teeth of bottom module 20, main module 30, and extension module 40 described in detail later; and gear teeth 122Lb which are drivingly connected with drive gear 126L. Rear pinion 122R includes: pinion teeth 122Ra which are meshed with rack teeth of bottom module 20, main module 30, and extension module 40 described in detail later; and gear teeth 122Rb which are drivingly connected with drive gear 126R.

Drive gear 126L, 126R is drivingly connected to gear teeth 122Lb, 122Rb of rear pinion 122L, 122R by way of power transmission gear 128.

As shown in FIG. 11 and FIG. 15, one drive gear 126L of rear pinion unit 120 is also drivingly connected to power transmission gear 100 of front pinion unit 90 by way of connection shaft 130 extending in the X axis direction. Accordingly, drive gear 126L of rear pinion unit 120 is rotatably driven by drive gear 96 of front pinion unit 90 by way of power transmission gears 98, 100 of front pinion unit 90. That is, drive gear 126L of rear pinion unit 120 is rotatably driven by motor 106.

As shown in FIG. 8 and FIG. 12, the other drive gear 126R of rear pinion unit 120 is drivingly connected to power transmission gear 134 of front pinion unit 90 by way of connection shaft 132 extending in the X axis direction. Power transmission gear 134 is drivingly connected to drive gear 138 by way of power transmission gear 136.

As shown in FIG. 13, drive gear 138 is rotatably driven by motor 140 mounted on a back side (the lower side in the Z axis direction) of base portion 72 of magazine carrier unit 70. Specifically, drive gear 138 is rotatably driven by motor 140 by way of worm 142 mounted on motor 140, worm wheel 144 meshed with worm 142, and power transmission shaft 146 which transmits power of motor 140 from worm wheel 144 to drive gear 138. Although the detailed description is made later, in the same manner as power transmission gear 98 and power transmission shaft 112, a drive connection between drive gear 138 and power transmission shaft 146 can be released by clutch lever 148.

Accordingly, front pinion 92 of front pinion unit 90 and one rear pinion 122L of rear pinion unit 120 are driven by the same motor 106. The other rear pinion 122R of rear pinion unit 120 is driven by motor 140.

Next, the racks which are meshed with front pinion 92 and rear pinions 122L, 122R of magazine carrier unit 70 are described.

Figure 17:
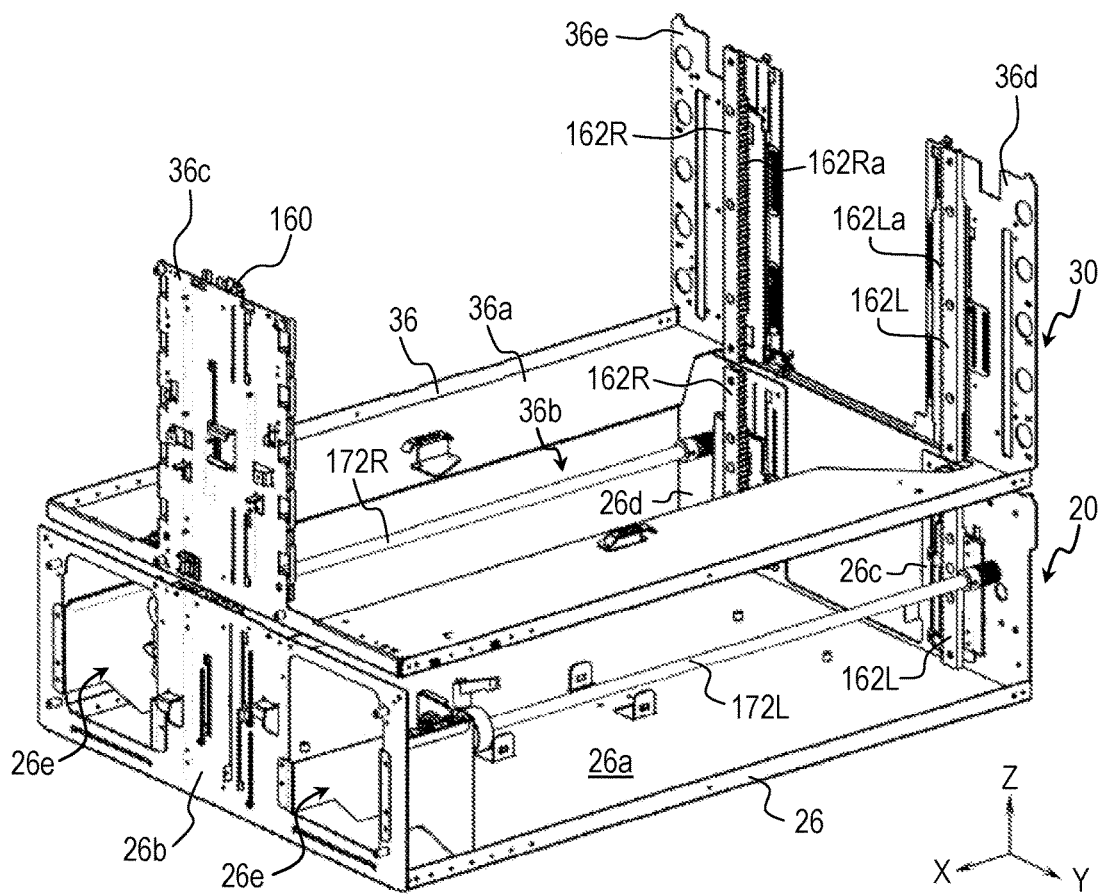
FIG. 17 is an exploded view of a part of the conveyance robot apparatus for describing racks according to the exemplary embodiment.
Figure 18:
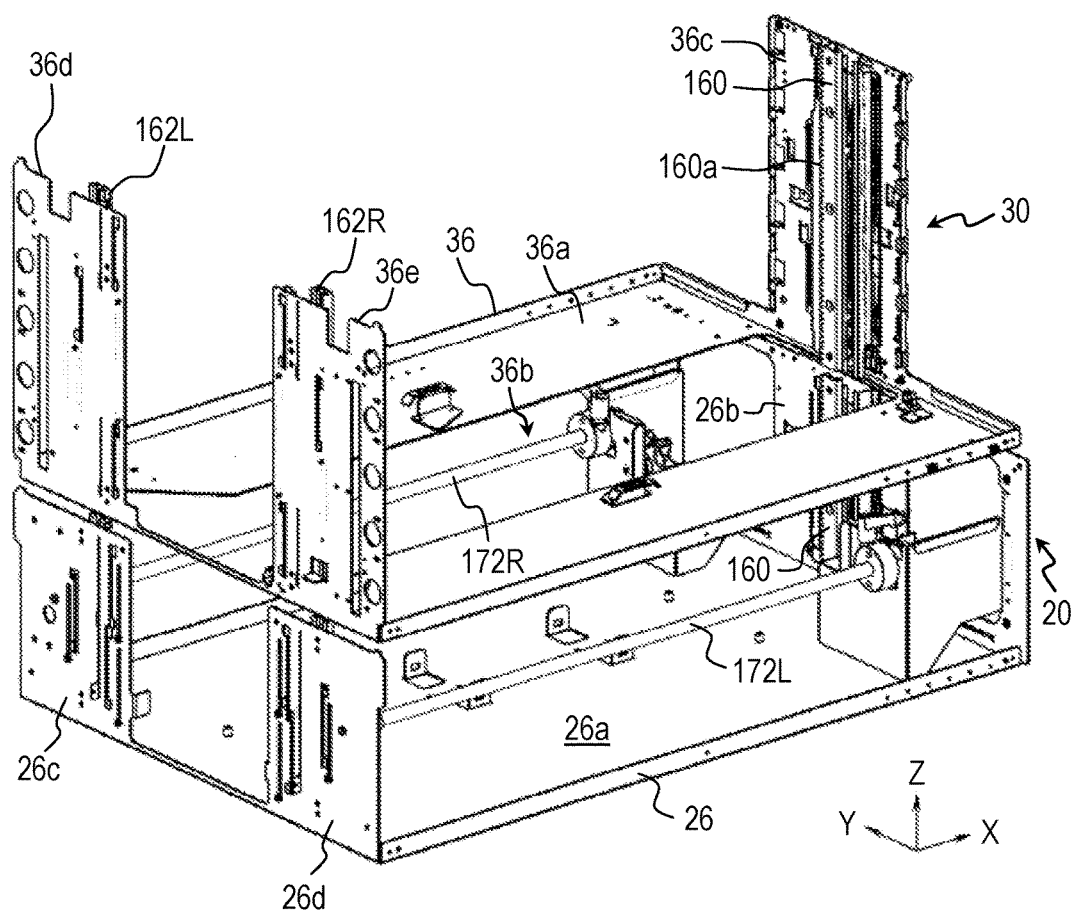
FIG. 18 is a partially exploded view of the conveyance robot apparatus as viewed from a viewpoint different from FIG. 17 for describing the racks according to the exemplary embodiment.

FIG. 17 and FIG. 18 are exploded views of a part of conveyance robot apparatus 10 as viewed from different viewpoints for describing the racks. FIG. 17 and FIG. 18 show the racks mounted on bottom module 20 and main module 30. In FIG. 17 and FIG. 18, to facilitate the visual recognition of the racks, bottom module 20 and main module 30 are partially shown.

As shown in FIG. 17 and FIG. 18, bottom module 20 includes chassis 26, and main module 30 includes chassis 36. As shown in FIG. 1 and FIG. 4, left side panel 22L, right side panel 22R, front panel 24 and the like are mounted on chassis 26 of bottom module 20. In the same manner, left side panel 32L, right side panel 32R, front panel 34 and the like are mounted on chassis 36 of main module 30.

As shown in FIG. 17 and FIG. 18, chassis 26 of bottom module 20 includes base portion 26a forming a bottom surface of bottom module 20. Chassis 26 also includes side wall portions 26b, 26c, 26d extending in the Z axis direction from a front side and a rear side of base portion 26a of chassis 26.

Although the reason is described later, opening 26e is formed on both sides in the Y axis direction of front side wall portion 26b. Rear side wall portions 26c, 26d are respectively formed on both sides in the Y axis direction of base portion 26a.

Chassis 36 of main module 30 includes base portion 36a forming a bottom surface of main module 30. Base portion 36a has through hole 36b through which magazine carrier unit 70 passes in the Z axis direction.

Chassis 36 of main module 30 includes side wall portions 36c, 36d, 36e extending in the Z axis direction from a front side and a rear side of base portion 36a of chassis 36.

Front side wall portion 36c is formed at a center portion in the Y axis direction of base portion 36a of chassis 36. The reason is that magazine units 60L, 60R are mounted on main module 30 after magazine units 60L, 60R pass both left and right sides of front side wall portion 36c in the X axis direction.

On the other hand, rear side wall portions 36d, 36e are formed on both sides in the Y axis direction of base portion 36a of chassis 36. The reason is that slider unit 74 of magazine carrier unit 70 passes between two rear side wall portions 36d, 36e in the X axis direction so as to convey the plurality of discs D in magazine tray 52 placed on tray placement portion 74a of slider unit 74 to drive unit 80.

As shown in FIG. 18, on an inner side of each of front side wall portion 26b and rear side wall portions 26c, 26d of bottom module 20 and an inner side of each of front side wall portion 36c and rear side wall portions 36d, 36e of main module 30, a rack forming a part of the constitutional elements of the carrier unit moving mechanism is formed.

Specifically, front rack 160 forming a part of the constitutional elements of the carrier unit moving mechanism is formed on each of front side wall portion 26b of bottom module 20 and front side wall portion 36c of main module 30 in a slidable manner in the Z axis direction. Front rack 160 of bottom module 20 and front rack 160 of main module 30 are arranged in one row in the Z axis direction.

Figure 19:
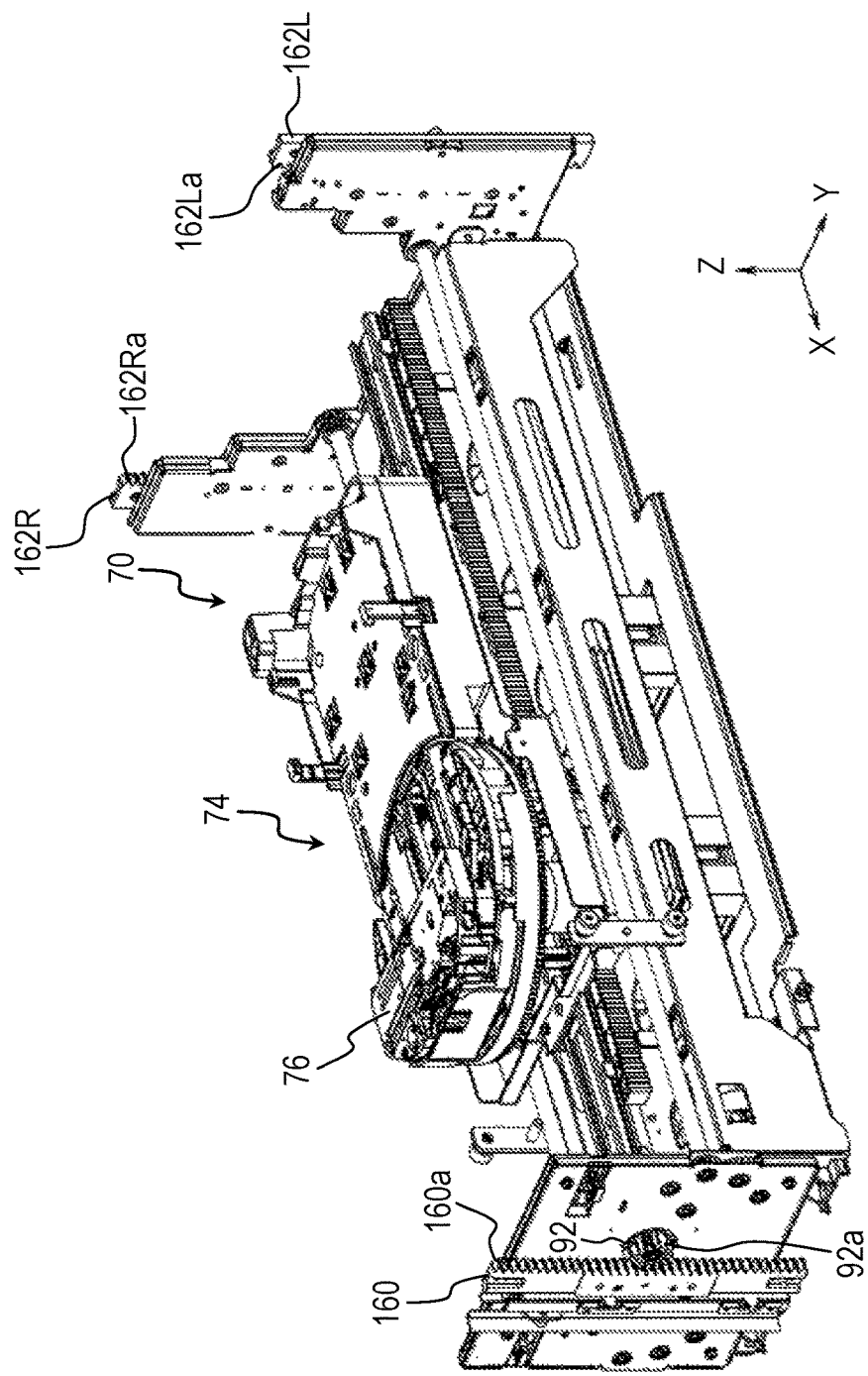
FIG. 19 is a view showing a state where a front pinion and a front rack according to the exemplary embodiment are meshed with each other.

FIG. 19 is a view showing a state where the front pinion and the front rack according to the exemplary embodiment are meshed with each other. As shown in FIG. 19, front rack 160 has rack teeth 160a which extend in the Z axis direction, and are meshed with pinion teeth 92a of front pinion 92 of magazine carrier unit 70.

As shown in FIG. 17, on each of one rear side wall portion 26c of bottom module 20 and one rear side wall portion 36d of main module 30, rear rack 162L forming a part of the constitutional elements of the carrier unit moving mechanism is formed in a slidable manner in the Z axis direction. Rear rack 162L of bottom module 20 and rear rack 162L of main module 30 are arranged in one row in the Z axis direction.

As shown in FIG. 17, on each of the other rear side wall portion 26d of bottom module 20 and the other rear side wall portion 36e of main module 30, rear rack 162R forming a part of the constitutional elements of the carrier unit moving mechanism is formed in a slidable manner in the Z axis direction. Rear rack 162R of bottom module 20 and rear rack 162R of main module 30 are arranged in one row in the Z axis direction.

Figure 20:
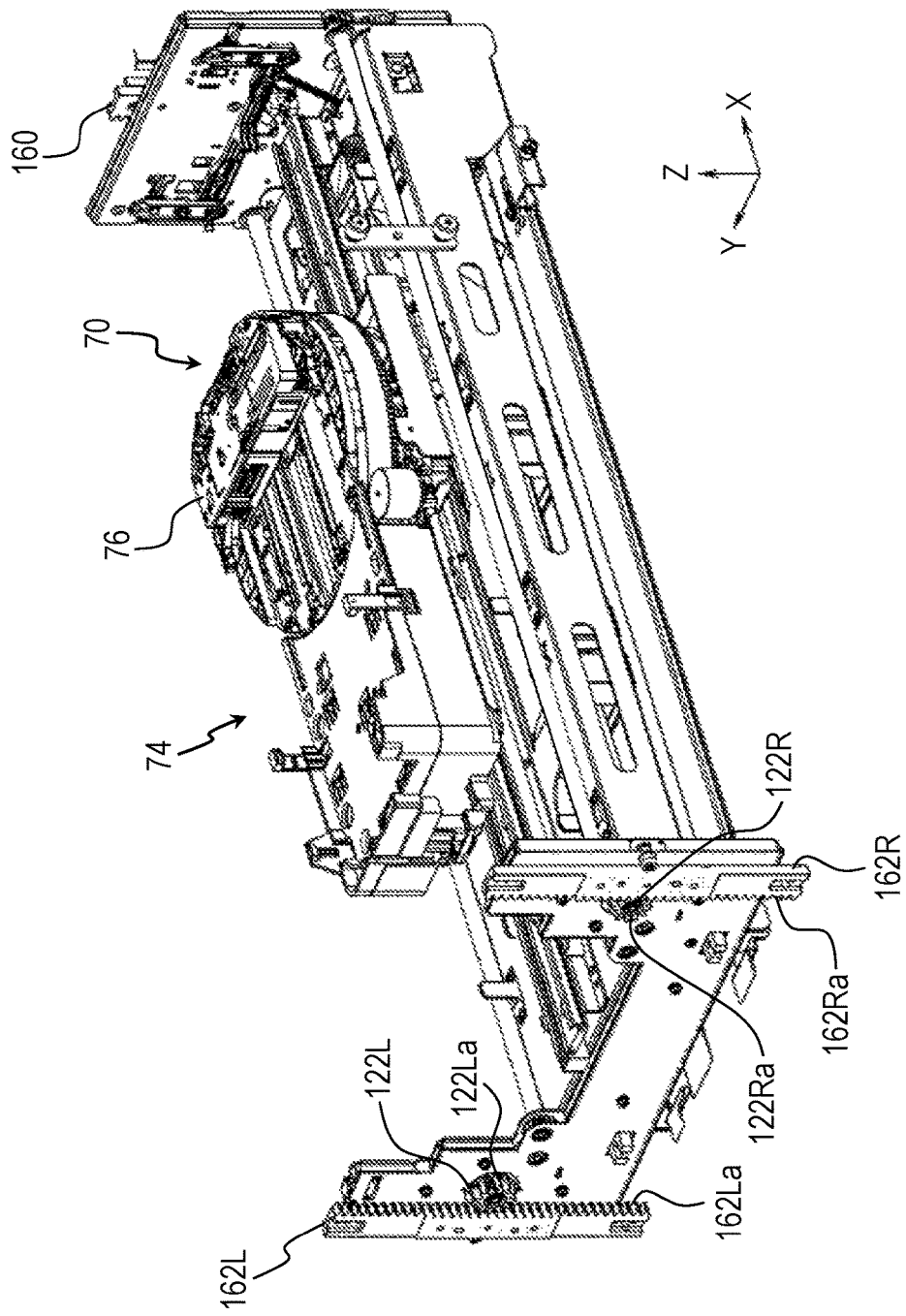
FIG. 20 is a view showing a state where a rear pinion and a rear rack according to the exemplary embodiment are engaged with each other.

FIG. 20 is a view showing a state where the rear pinion and the rear rack are meshed with each other. As shown in FIG. 20, rear rack 162L has rack teeth 162La which extend in the Z axis direction, and are meshed with pinion teeth 122La of one rear pinion 122L of magazine carrier unit 70.

As shown in FIG. 20, rear rack 162R has rack teeth 162Ra which extend in the Z axis direction, and are meshed with pinion teeth 122Ra of the other rear pinion 122R of magazine carrier unit 70.

In the same manner, front rack 160 and rear racks 162L, 162R are also formed on extension module 40.

As described above, front rack 160 and rear racks 162L, 162R are supported on each of bottom module 20, main module 30, and extension module 40 in a freely slidable manner in the Z axis direction.

Figure 21:
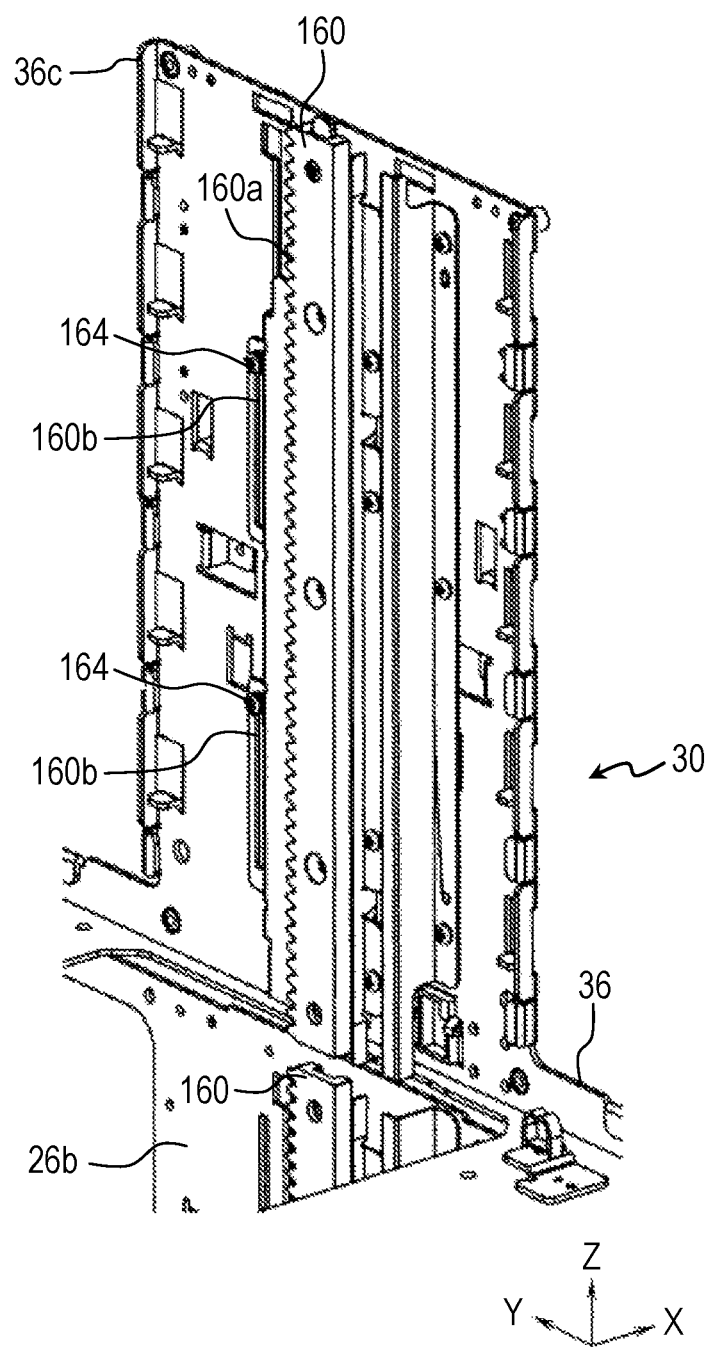
FIG. 21 is an enlarged view of the front rack according to the exemplary embodiment.
Figure 22:
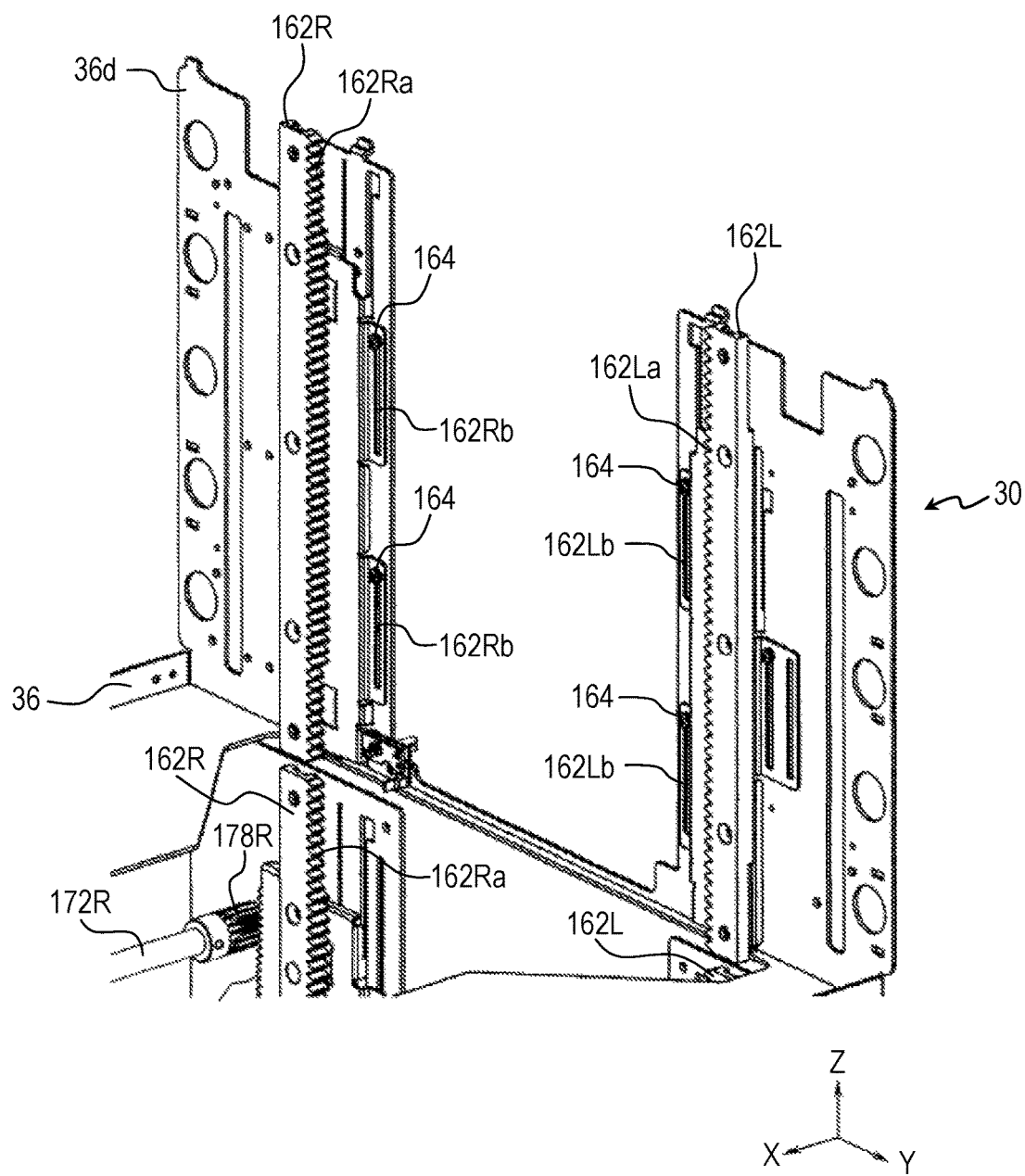
FIG. 22 is an enlarged view of the rear racks according to the exemplary embodiment.

FIG. 21 is an enlarged view of front rack 160, and FIG. 22 is an enlarged view of rear racks 162R, 162L. For example, as shown in FIG. 21, front rack 160 has a plurality of guide holes 160b extending in the Z axis direction. A plurality of bolts 164 are fixed to front side wall portion 36c of chassis 36 of main module 30 in a state where shaft portions of bolts 164 are made to pass through these guide holes 160b.

For example, as shown in FIG. 22, rear rack 162L, 162R has a plurality of guide holes 162Lb, 162Rb extending in the Z axis direction. A plurality of bolts 164 are fixed to rear side wall portion 36d, 36e of chassis 36 of main module 30 in a state where shaft portions of bolts 164 are made to pass through these guide holes 162Lb, 162Rb.

As shown in FIG. 21 and FIG. 22, guide holes 160b, 162Lb, 162Rb are guided by these bolts 164 so that front rack 160 and rear racks 162L, 162R can be made to slide in the Z axis direction. By further fastening bolts 164, front rack 160, and rear racks 162L, 162R can be fixed to bottom module 20, main module 30, and extension module 40 in a non-slidable manner.

In this exemplary embodiment, each of front rack 160 and rear racks 162L, 162R is slidable so that each of front rack 160 and rear racks 162L, 162R is moved in the downward direction due to its own weight. At this stage of operation, as shown in FIG. 18, front rack 160 of main module 30 is spaced apart from front rack 160 of bottom module 20 which is disposed adjacently to front rack 160 of main module 30 in the Z axis direction. Although not shown in the drawing, front rack 160 of main module 30 is also spaced apart from front rack 160 of extension module 40 in the same manner. In the same manner, with respect to rear rack 162L, 162R of bottom module 20, rear rack 162L, 162R of main module 30, and rear rack 162L, 162R of extension module 40, two rear racks 162L, 162R which are disposed adjacently to each other in the Z axis direction are spaced apart from each other.

In addition to the above, each of the plurality of front racks 160 does not straddle over two modules in a state where one front rack 160 is spaced apart from another front rack 160 disposed adjacently to each front rack 160 in the Z axis direction. For example, each of the plurality of front racks 160 is stored as a whole in the module which supports each front rack 160. In the same manner, each of plurality of rear racks 162L, 162R does not straddle over two modules in a state where one rear rack 162L, 162R is spaced apart from another rear rack 162L, 162R disposed adjacently to each rear rack 162L, 162R in the Z axis direction.

Each front rack 160 is spaced apart from another front rack 160 disposed adjacently to each front rack 160 in the Z axis direction and hence, as a matter of course, front pinion 92 of magazine carrier unit 70 cannot be rolled over the plurality of front racks 160. In the same manner, each rear rack 162L, 162R is spaced apart from another rear rack 162L, 162R disposed adjacently to each rear rack 162L, 162R in the vertical direction and hence, rear pinion 122L, 122R of magazine carrier unit 70 cannot be rolled over the plurality of rear racks 162L, 162R. That is, magazine carrier unit 70 cannot move in such a manner that magazine carrier unit 70 passes over the plurality of modules consisting of bottom module 20, main module 30, and extension module 40 in the vertical direction.

Accordingly, it is necessary to connect the plurality of front racks 160 arranged in a row in the Z axis direction at intervals with each other. In the same manner, it is also necessary to connect the plurality of rear racks 162L, 162R arranged in a row in the vertical direction at intervals with each other.

In this exemplary embodiment, with respect to the plurality of front racks 160 arranged in a row in the Z axis direction at intervals, each of the plurality of front racks 160 is connected to another front rack 160 disposed adjacently to each front rack 160 by making front rack 160 positioned at one terminal end slide toward front rack 160 positioned at the other terminal end.

Figure 23:
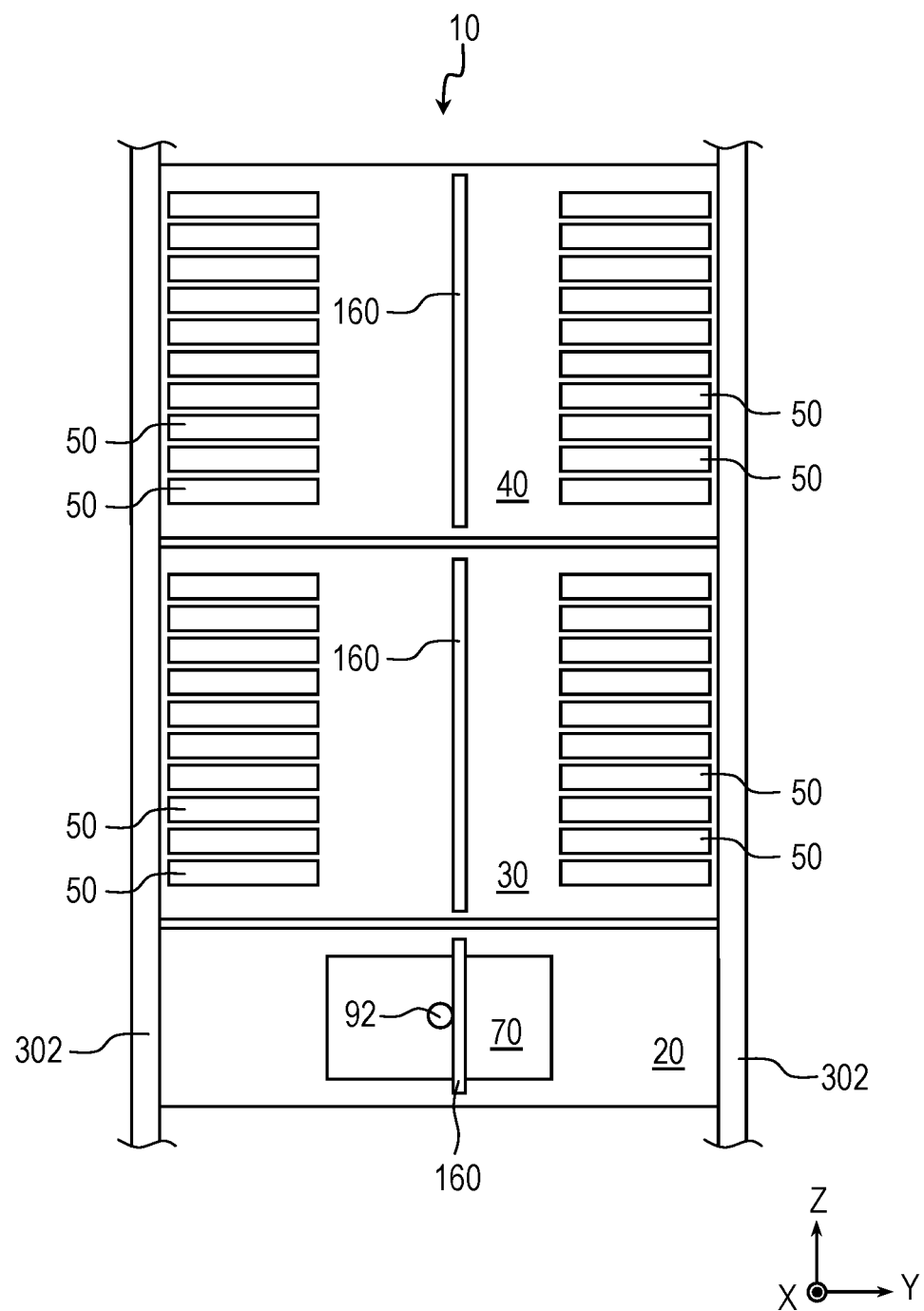
FIG. 23 is a view for describing a connection between a plurality of front racks of the conveyance robot apparatus according to the exemplary embodiment.
Figure 24:
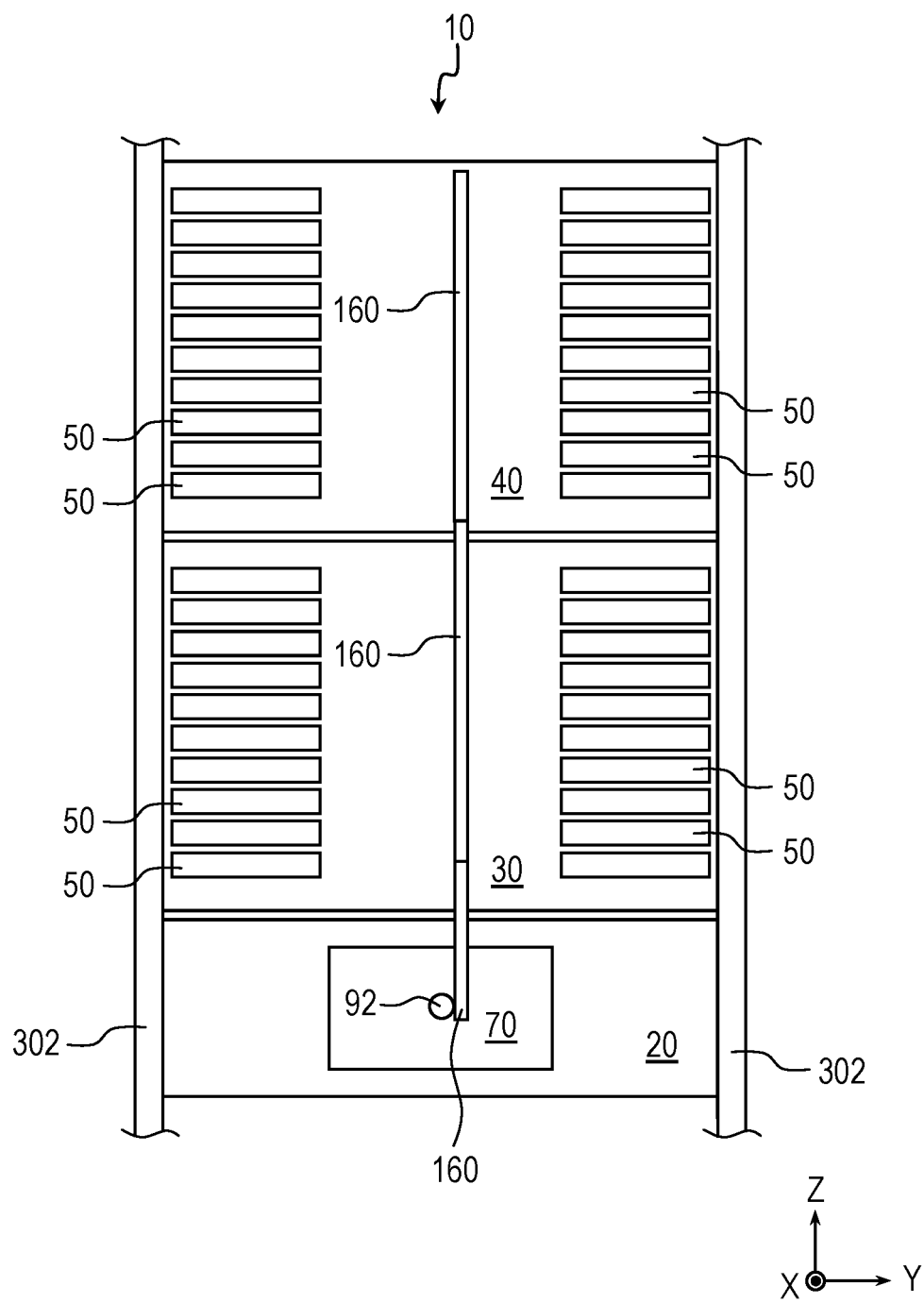
FIG. 24 is another view for describing the connection between the plurality of front racks of the conveyance robot apparatus according to the exemplary embodiment.

FIG. 23 and FIG. 24 are views for describing a connection between the plurality of front racks 160 of conveyance robot apparatus 10 according to the exemplary embodiment. Specifically, as shown in FIG. 23 and FIG. 24, front rack 160 supported on bottom module 20 in a slidable manner in the Z axis direction is made to slide in the upward direction toward front rack 160 supported on extension module 40. With such an operation, an upper end of front rack 160 of bottom module 20 is brought into contact with a lower end of front rack 160 supported on main module 30 in a slidable manner.

Further, when front rack 160 of bottom module 20 is moved in the upward direction in a state where front rack 160 of bottom module 20 is brought into contact with front rack 160 of main module 30, front rack 160 of main module 30 is also moved in the upward direction thus being brought into contact with front rack 160 of extension module 40. As a result, front racks 160 of three modules consisting of bottom module 20, main module 30, and extension module 40 are connected with each other in one row so that front pinion 92 of magazine carrier unit 70 can be rolled over these front racks 160.

As described above, front rack 160 of extension module 40 is fixed to extension module 40 in a non-slidable manner by fastening bolts 164. As shown in FIG. 24, in a state where each of the plurality of front racks 160 is connected to another front rack 160 disposed adjacently to each front rack 160, some front racks 160 straddle over two modules disposed adjacently to each other. Specifically, with respect to front rack 160 supported on bottom module 20, a portion of front rack 160 enters main module 30. With respect to front rack 160 supported on main module 30, a portion of front rack 160 enters extension module 40.

In the same manner, rear racks 162L, 162R supported on bottom module 20 in a slidable manner are made to slide in the upward direction toward rear racks 162L, 162R of extension module 40. With such an operation, respective rear racks 162L, 162R of three modules consisting of bottom module 20, main module 30, and extension module 40 can be connected with each other.

Figure 25:
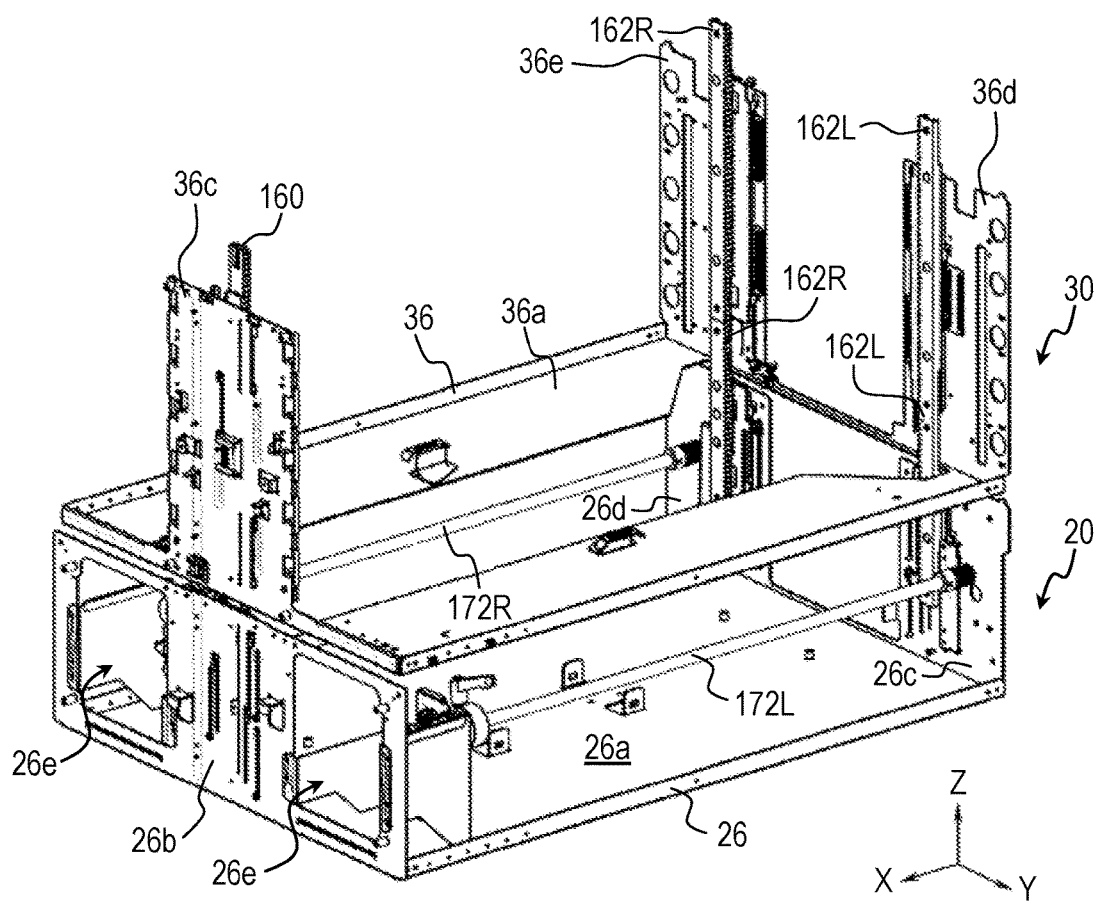
FIG. 25 is a perspective view of a part of the conveyance robot apparatus in a state where the plurality of rear racks according to the exemplary embodiment are connected with each other.

FIG. 25 is a perspective view of a part of conveyance robot apparatus 10 according to the exemplary embodiment in a state where the plurality of rear racks 162L, 162R are connected with each other. For example, as shown in FIG. 25, rear racks 162L, 162R of bottom module 20 are connected to rear racks 162L, 162R of main module 30. As a result, rear pinions 122L, 122R of magazine carrier unit 70 can be rolled over the plurality of rear racks 162L, 162R.

The description is made with respect to the rack connecting mechanism which connects front rack 160 and rear racks 162L, 162R of bottom module 20, front rack 160 and rear racks 162L, 162R of main module 30, and front rack 160 and rear racks 162L, 162R of extension module 40 with each other by making front rack 160 and rear racks 162L, 162R supported on bottom module 20 in a slidable manner slide.

Figure 26:
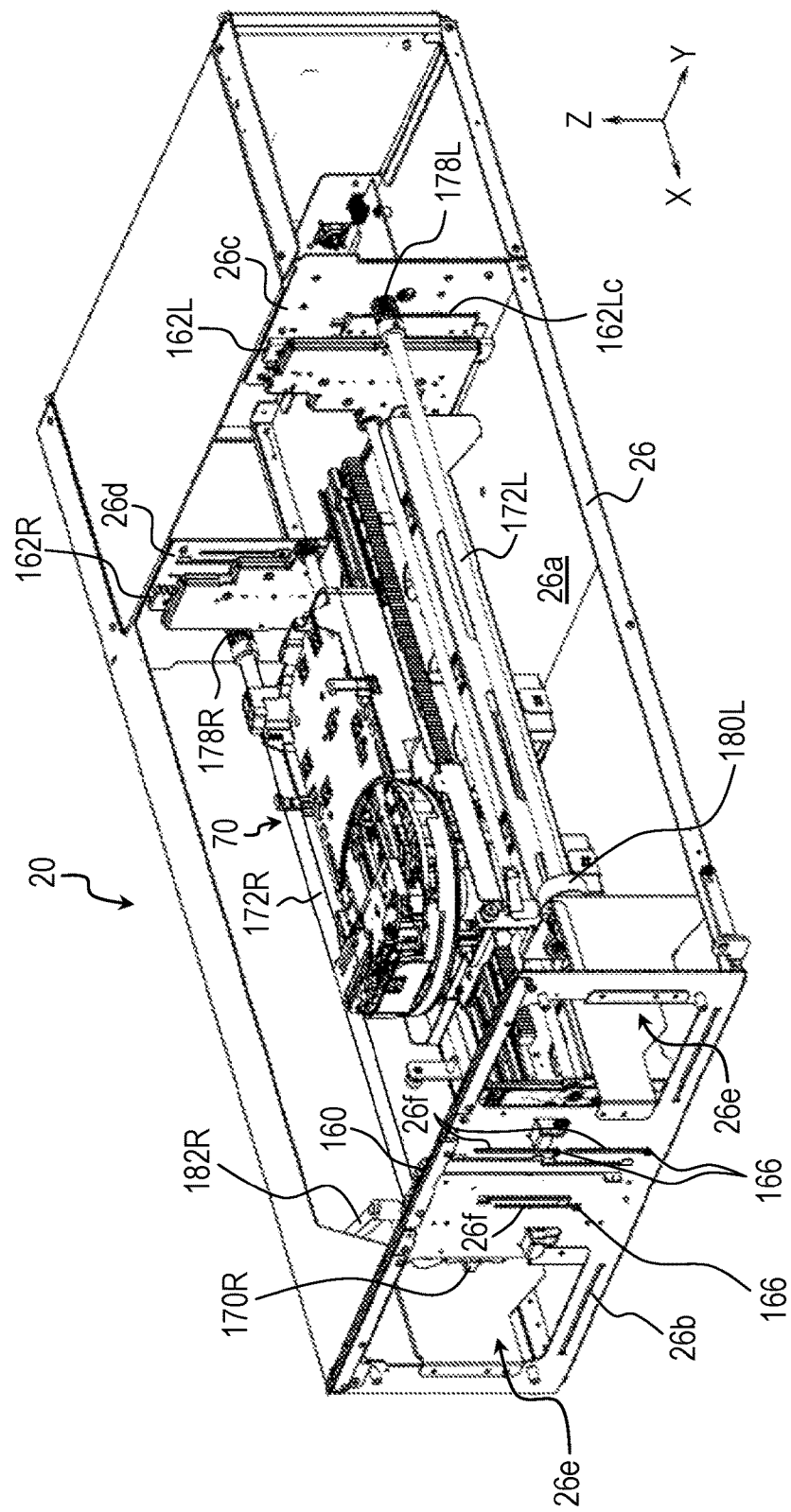
FIG. 26 is a perspective view of a bottom module in a state where the bottom module stores the magazine carrier unit according to the exemplary embodiment.
Figure 27:
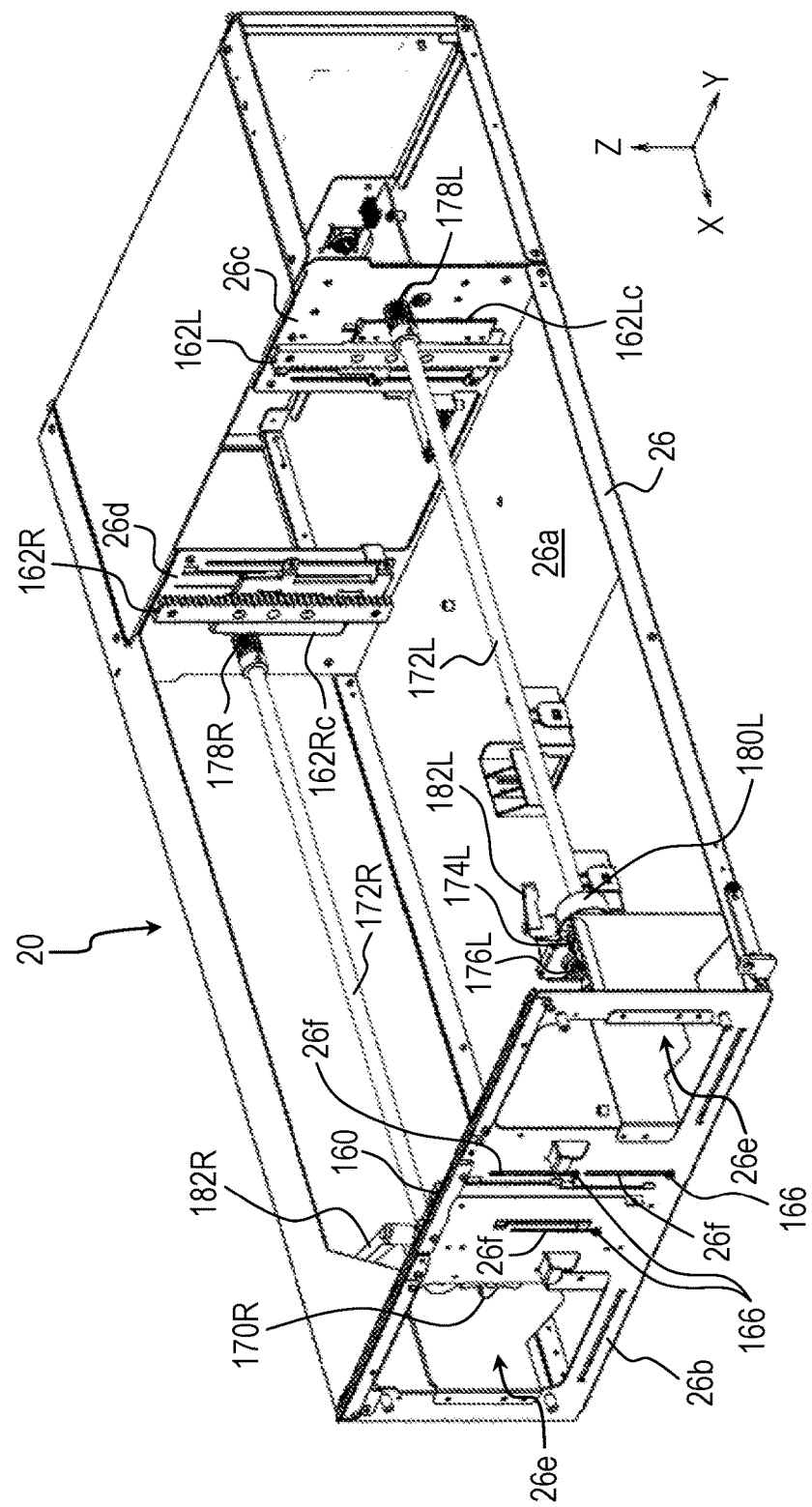
FIG. 27 is a perspective view of the bottom module according to the exemplary embodiment.

FIG. 26 is a perspective view of bottom module 20 in a state where bottom module 20 stores magazine carrier unit 70 according to the exemplary embodiment, and FIG. 27 is a perspective view of bottom module 20 according to the exemplary embodiment. FIG. 26 and FIG. 27 show bottom module 20 in a state where front panel 24, left side panel 22L, and right side panel 22R of bottom module 20 are removed.

First, in this exemplary embodiment, the rack connecting mechanism for making front rack 160 and rear racks 162L, 162R of bottom module 20 slide in the Z axis direction is mounted on bottom module 20.

As shown in FIG. 26 and FIG. 27, a plurality of bolts 166 are mounted on front rack 160 of bottom module 20 in a state where shaft portions of bolts 166 are made to pass through a plurality of guide holes 26f formed in front side wall portion 26b and extending in the Z axis direction. The plurality of bolts 166 are mounted on front rack 160 through guide holes 26f formed in front side wall portion 26b in a state where head portions of bolts 166 are positioned outside bottom module 20.

By the plurality of bolts 166 and the plurality of guide holes 26f, front rack 160 is supported on front side wall portion 26b of bottom module 20 in a slidable manner in the Z axis direction. Front rack 160 can be fixed to front side wall portion 26b by further fastening the plurality of bolts 166. That is, front rack 160 of bottom module 20 is fixed in a state where front rack 160 of bottom module 20 is made to slide in the upward direction. Accordingly, it is possible to maintain a state where front rack 160 of bottom module 20, front rack 160 of main module 30, and front rack 160 of extension module 40 are connected with each other.

The rack connecting mechanism for making rear racks 162L, 162R of bottom module 20 slide is different from the above-mentioned rack connecting mechanism for making front rack 160 slide. Specifically, as shown in FIG. 26 and FIG. 27, bottom module 20 is formed such that rear racks 162L, 162R disposed on the rear side of bottom module 20 can be made to slide in the Z axis direction in response to an operation performed from the front side of bottom module 20.

Figure 28:
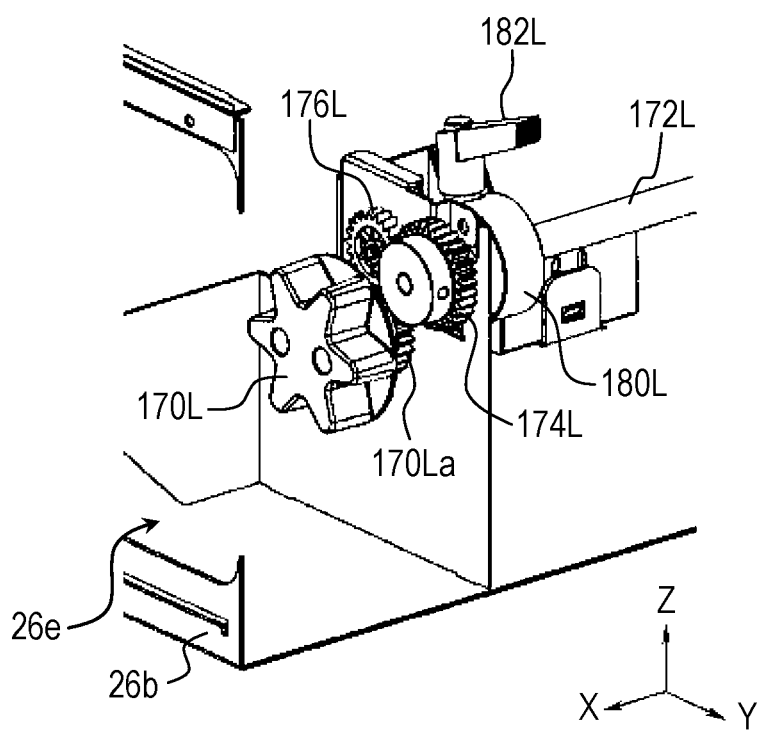
FIG. 28 is an enlarged view of a front side end of a rack drive shaft according to the exemplary embodiment and an area around the front side end of the rack drive shaft.
Figure 29:
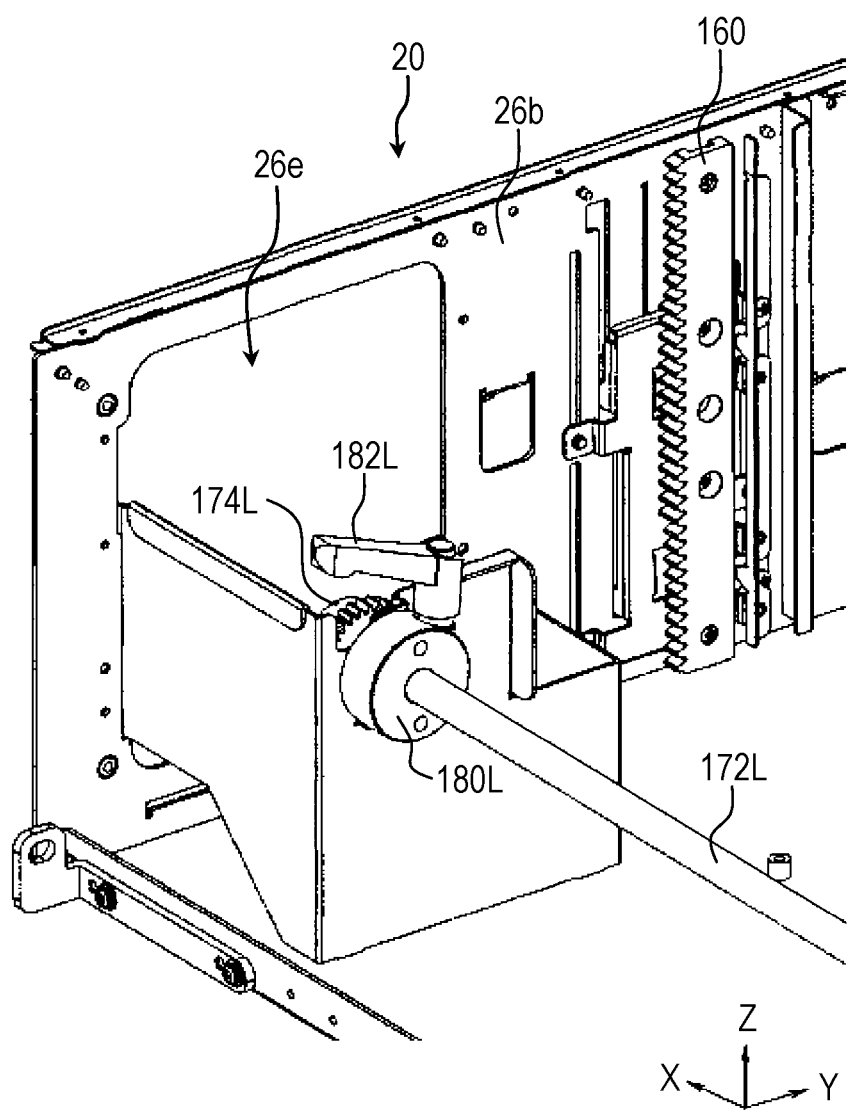
FIG. 29 is an enlarged view of the front side end of the rack drive shaft according to the exemplary embodiment and the area around the front side end of the rack drive shaft as viewed in a direction different from FIG. 28.

FIG. 28 and FIG. 29 are enlarged views of a front side end of a rack drive shaft according to the exemplary embodiment and an area around the front side end of the rack drive shaft.

As shown in FIG. 26 to FIG. 28, the rack connecting mechanism provided for moving rear racks 162L, 162R in the Z axis direction includes: handles 170L, 170R mounted on the front side of bottom module 20; and rack drive shafts 172L, 172R extending from the front side to the rear side of bottom module 20 as shown in FIG. 26 to FIG. 29.

Handle 170L, 170R is mounted on bottom module 20 in a rotatable manner about an axis of rotation which extends in the X axis direction. Handle 170L, 170R can be accessed through opening 26e formed in front side wall portion 26b of chassis 26 of bottom module 20. Gear teeth 170La are formed on handle 170L. In the same manner, gear teeth not shown in the drawing are formed also on handle 170R.

As shown in FIG. 26, rack drive shafts 172L, 172R extend parallel to each other along the X axis direction of conveyance robot apparatus 10 such that rack drive shafts 172L, 172R sandwich magazine carrier unit 70.

Gear 174L is mounted on the front side end of rack drive shaft 172L. Gear 174L is drivingly connected to gear teeth 170La of handle 170L by way of gear 176L. With such a configuration, when handle 170L is rotated, rack drive shaft 172L is rotated by way of gears 174L, 176L.

In the same manner, although not shown in the drawing, a gear not shown in the drawing which is drivingly connected to gear teeth not shown in the drawing of handle 170R is mounted also on the front side end of rack drive shaft 172R. With such a configuration, when handle 170R is rotated, rack drive shaft 172R is rotated.

As shown in FIG. 27, rack drive pinions 178L, 178R are mounted on rear side ends of rack drive shafts 172L, 172R, respectively. Rear rack 162L of bottom module 20 has rack teeth 162Lc which are meshed with rack drive pinion 178L. Rear rack 162R of bottom module 20 has rack teeth 162Rc which are meshed with rack drive pinion 178R.

Figure 30:
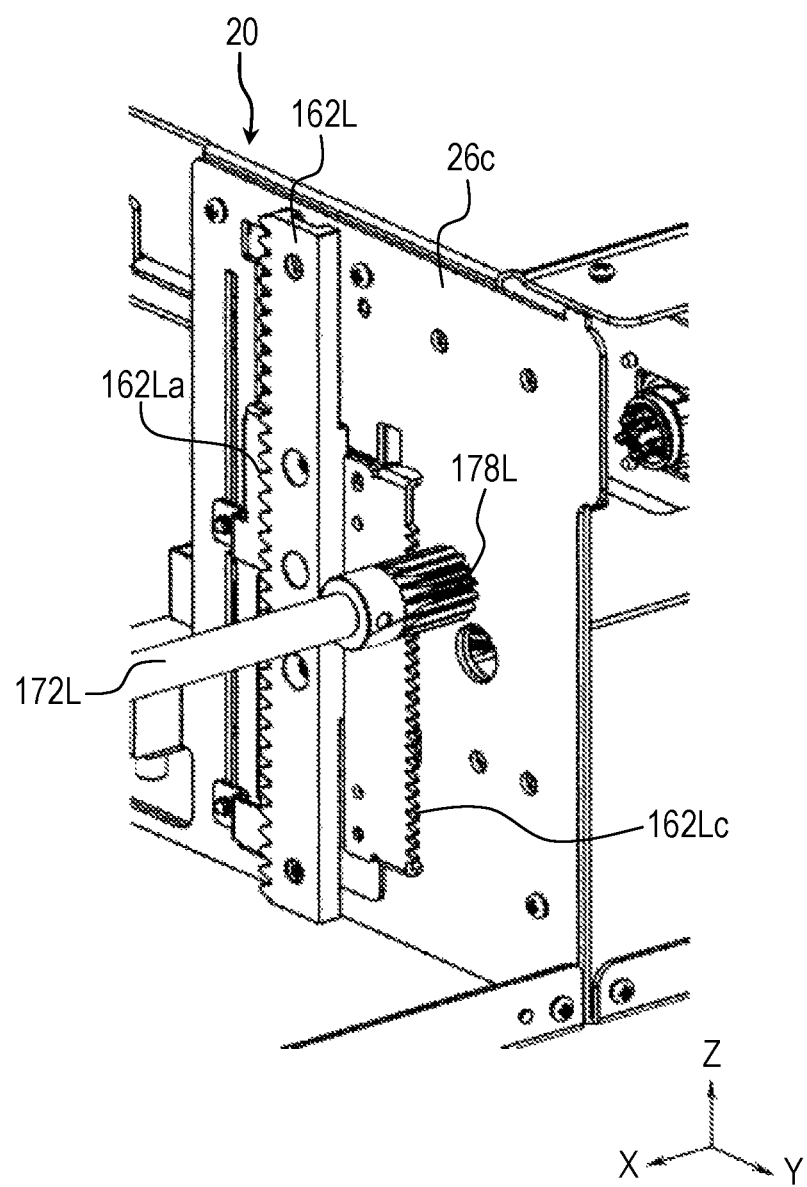
FIG. 30 is an enlarged view showing a rear side end of the rack drive shaft according to the exemplary embodiment and an area around the rear side end of the rack drive shaft.
Figure 31:
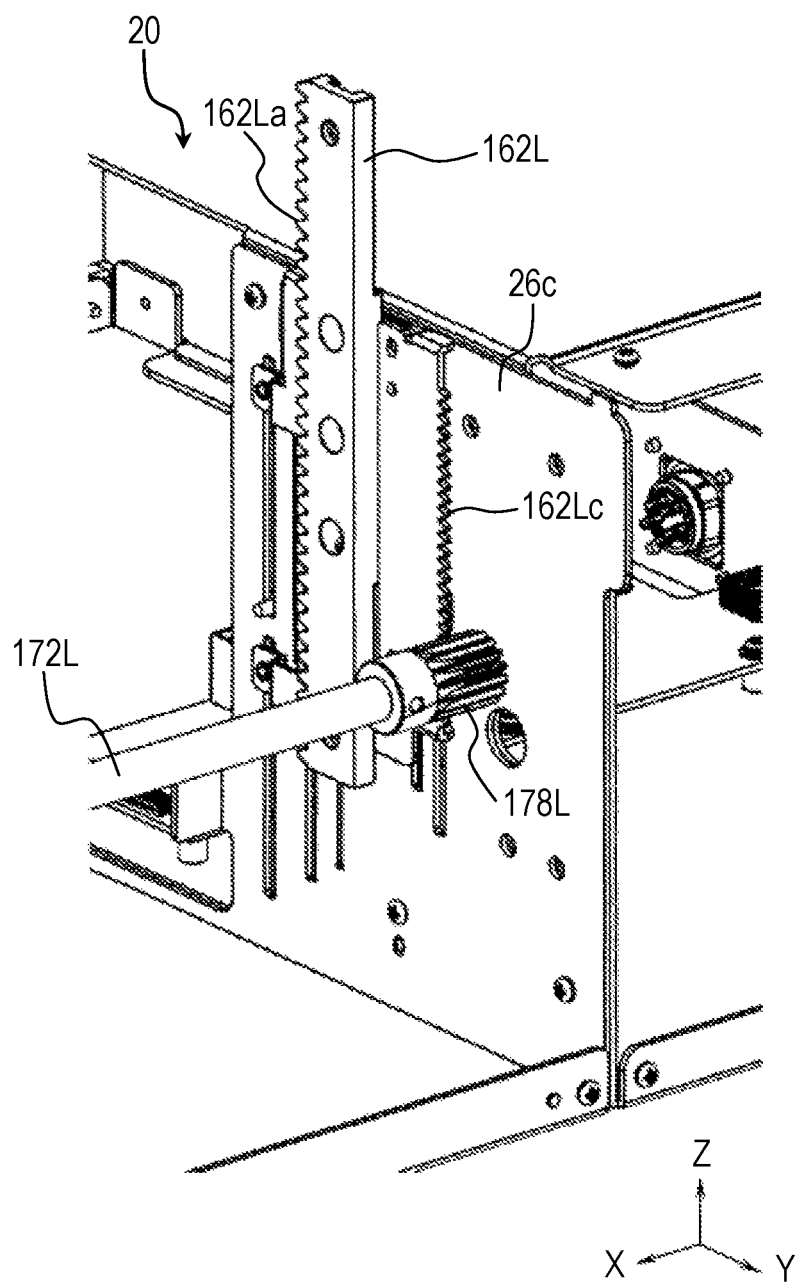
FIG. 31 is another enlarged view showing the rear side end of the rack drive shaft according to the exemplary embodiment and the area around the rear side end of the rack drive shaft.

FIG. 30 and FIG. 31 are enlarged views showing the rear side end of rack drive shaft 172L according to the exemplary embodiment and an area around the rear side end of rack drive shaft 172L.

As shown in FIG. 30 and FIG. 31, when rack drive shaft 172L is rotated, rear rack 162L is moved in the Z axis direction by way of rack drive pinion 178L and rack teeth 162Lc. As a result, rear rack 162L of bottom module 20 is brought into contact with rear rack 162L of main module 30 and, eventually, rear rack 162L of bottom module 20, rear rack 162L of main module 30, and rear rack 162L of extension module 40 are connected with each other.

In the same manner, when rack drive shaft 172R is rotated, rear rack 162R is moved in the Z axis direction by way of rack drive pinion 178R and rack teeth 162Rc. As a result, rear rack 162R of bottom module 20 is brought into contact with rear rack 162R of main module 30 and, eventually, rear rack 162R of bottom module 20, rear rack 162R of main module 30, and rear rack 162R of extension module 40 are connected with each other.

To maintain a state where rear racks 162L, 162R of bottom module 20, rear racks 162L, 162R of main module 30, and rear racks 162L, 162R of extension module 40 are connected with each other, a rotation preventing mechanism which maintains rack drive shafts 172L, 172R in a non-rotatable state is mounted on bottom module 20. As shown in FIG. 29, the rotation preventing mechanism is formed of collar 180L which is fixed to bottom module 20 and is fitted on rack drive shaft 172L, and lever 182L which fastens the collar. When lever 182L is operated, collar 180L is fastened, and rack drive shaft 172L is gripped in a non-rotatable manner by collar 180L.

In the same manner, rotation preventing mechanism is formed of a collar not shown in the drawing which is fixed to bottom module 20 and is fitted on rack drive shaft 172R, and a lever not shown in the drawing which fastens the collar. When the lever is operated, the collar not shown in the drawing which is fitted on rack drive shaft 172R is fastened, and rack drive shaft 172R is gripped in a non-rotatable manner by the collar.

As described above, front rack 160 and rear racks 162L, 162R can be moved in the Z axis direction by the operation performed from the front side of conveyance robot apparatus 10 and hence, a connection operation of the racks can be efficiently performed.

When fixing of front rack 160 of bottom module 20 to front side wall portion 26b is released, that is, when bolts 166 are loosened, front rack 160 of bottom module 20 is separated from front rack 160 of extension module 40 due to its own weight. As shown in FIG. 23, each of front rack 160 of bottom module 20, front rack 160 of main module 30, and front rack 160 of extension module 40 is separated from other front racks 160 disposed adjacently to each front rack 160 due to its own weight. As a result, front rack 160 which straddles over two modules as shown in FIG. 24 retracts to the module disposed on a lower side. For example, although an upper end portion of front rack 160 of main module 30 enters extension module 40 when front racks 160 are in a connected state as shown in FIG. 24, front rack 160 of main module 30 retracts from extension module 40, and is stored in main module 30 as shown in FIG. 23.

In the same manner, when the restriction of rotation of rack drive shaft 172L, 172R is released, that is, when the collars are loosened by operating lever 182L, 182R which fastens the collar fitted on rack drive shaft 172L, 172R, fixing of rear rack 162L, 162R of bottom module 20 is released, and rear rack 162L, 162R of bottom module 20 is separated from rear rack 162L, 162R of extension module 40 due to its own weight. Thus, each of rear rack 162L, 162R of bottom module 20, rear rack 162L, 162R of main module 30, and rear rack 162L, 162R of extension module 40 is separated from other rear racks 162L, 162R disposed adjacently to each rear rack 162L, 162R due to its own weight.

As a result, rear rack 162L, 162R which straddles over two modules retracts to the module disposed on the lower side. For example, although an upper end portion of rear rack 162L, 162R of bottom module 20 enters main module 30 when rear racks 162L, 162R are in a connected state as shown in FIG. 25, rear rack 162L, 162R of bottom module 20 retracts from main module 30 and is stored in bottom module 20 as shown in FIG. 17.

As described above, by releasing a connection of the plurality of front racks 160 and rear racks 162L, 162R, a state where front rack 160 and rear racks 162L, 162R straddle over two modules is eliminated. Accordingly, the construction and configuration change of conveyance robot apparatus 10 can be performed in a short time.

As shown in FIG. 1, main module 30 disposed between bottom module 20 and extension module 40 can be exchanged without removing bottom module 20 and extension module 40 from rack frame 300. That is, main module 30 can be exchanged without being brought into contact with front rack 160 and rear racks 162L, 162R of bottom module 20 and front rack 160 and rear racks 162L, 162 of extension module 40.

Further, after main module 30 is exchanged, by merely moving front rack 160 and rear racks 162L, 162R of bottom module 20, conveyance robot apparatus 10 can be brought into a usable state. That is, magazine carrier unit 70 can be moved such that magazine carrier unit 70 passes through the plurality of modules consisting of bottom module 20, main module 30, and extension module 40.

In this exemplary embodiment, to connect front rack 160 and rear racks 162L, 162R of bottom module 20, front rack 160 and rear racks 162L, 162R of main module 30, and front rack 160 and rear racks 162L, 162R of extension module 40 with each other respectively, front rack 160 of bottom module 20 and rear racks 162L, 162R of bottom module 20 are moved independently. Accordingly, in moving front rack 160 of bottom module 20 and rear racks 162L, 162R of bottom module 20 independently, it is preferable that front pinion 92 of magazine carrier unit 70 which is meshed with the front rack 160 of bottom module 20 and rear pinions 122L, 122R of magazine carrier unit 70 which are meshed with rear racks 162L, 162R of bottom module 20 be freely rotatable.

Figure 32:
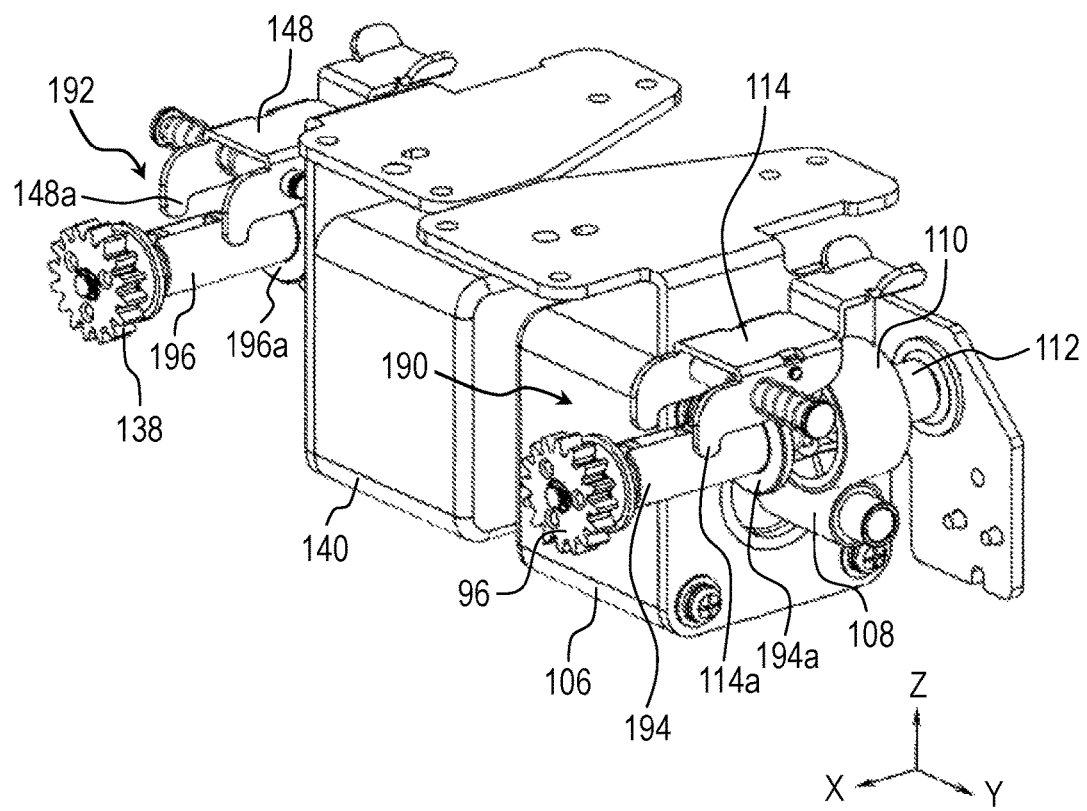
FIG. 32 is a perspective view showing a clutch mechanism according to the exemplary embodiment.
Figure 33:
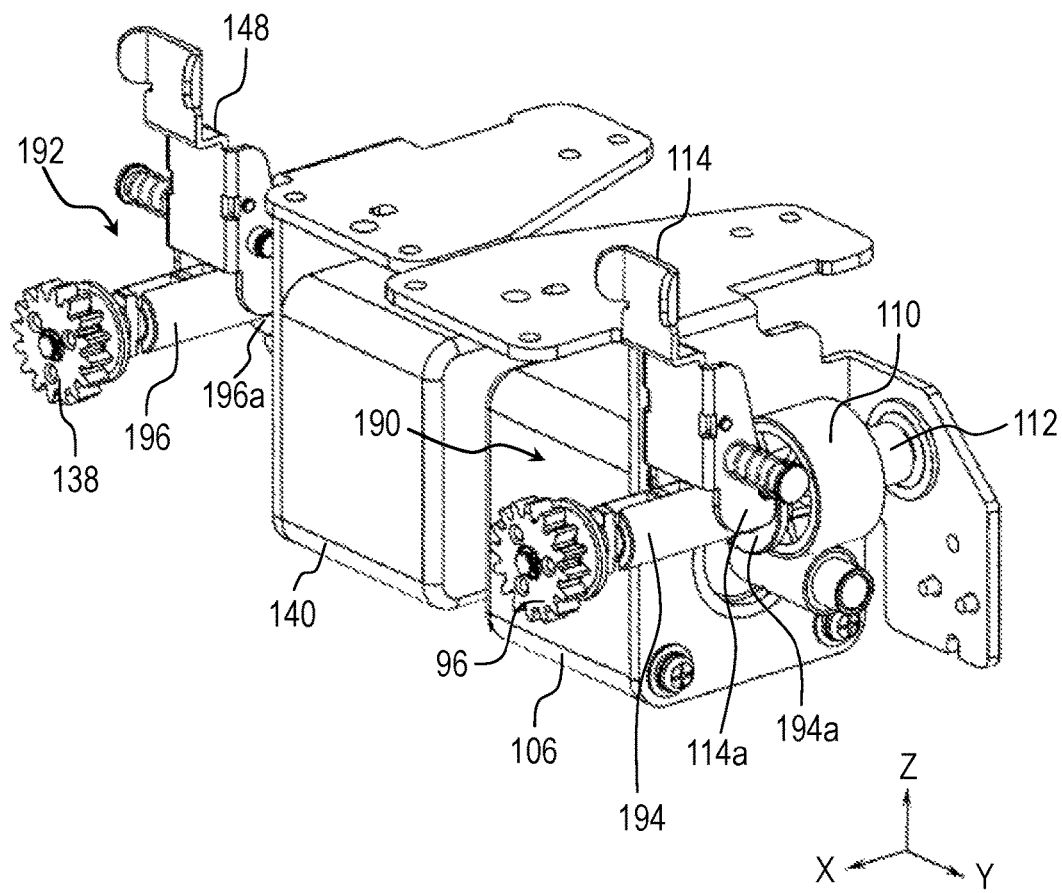
FIG. 33 is another perspective view showing the clutch mechanism according to the exemplary embodiment.

FIG. 32 and FIG. 33 are perspective views showing a clutch mechanism according to the exemplary embodiment. For example, in this exemplary embodiment, as shown in FIG. 32, conveyance robot apparatus 10 includes: clutch mechanism 190 which releases a drive connection between drive gear 96 for driving front pinion 92 and rear pinion 122L and motor 106 for driving drive gear 96; and clutch mechanism 192 which releases a drive connection between drive gear 138 for driving rear pinion 122R and motor 140 for driving drive gear 138.

Specifically, one clutch mechanism 190 includes: slide sleeve 194 which drivingly connects drive gear 96 and power transmission shaft 112 with each other in a releasable manner; and clutch lever 114 which makes slide sleeve 194 slide. The other clutch mechanism 192 includes: slide sleeve 196 which drivingly connects drive gear 138 and power transmission shaft 146 with each other in a releasable manner; and clutch lever 148 which makes slide sleeve 194 slide.

As shown in FIG. 13 and FIG. 32, slide sleeve 194 of clutch mechanism 190 is fitted on power transmission shaft 112. Slide sleeve 194 includes flange portion 194a. In the same manner, as shown in FIG. 13 and FIG. 32, slide sleeve 196 of clutch mechanism 192 is fitted on power transmission shaft 146. Slide sleeve 196 includes flange portion 196a.

Clutch lever 114 of clutch mechanism 190 is swung about a swing axis extending in the Y axis direction. As shown in FIG. 33, clutch lever 114 includes contact portion 114a which is brought into contact with flange portion 194a of slide sleeve 194 when clutch lever 114 is swung and which makes slide sleeve 194 slide. In the same manner, clutch lever 148 of clutch mechanism 192 is also swung about a swing axis extending in the Y axis direction. As shown in FIG. 32, clutch lever 148 includes contact portion 148a which is brought into contact with flange portion 196a of slide sleeve 196 when clutch lever 148 is swung and which makes slide sleeve 196 slide.

Hereinafter, the description is made with respect to a releaseable drive connection between drive gear 96 and power transmission shaft 112 by way of slide sleeve 194. The releaseable drive connection between drive gear 138 and power transmission shaft 146 by way of slide sleeve 196 is substantially the same as the releaseable drive connection between drive gear 96 and power transmission shaft 112 by way of slide sleeve 194 in principle. Accordingly, the description of the releaseable drive connection between drive gear 138 and power transmission shaft 146 by way of slide sleeve 196 is omitted.

Figure 34:
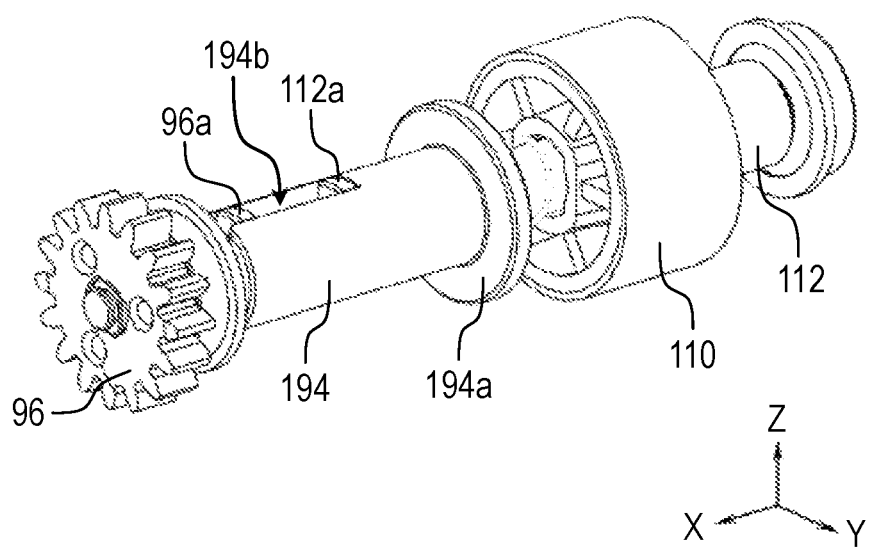
FIG. 34 is a perspective view showing a drive gear and a power transmission shaft in a state where the drive gear and the power transmission shaft are drivingly connected with each other by a slide sleeve according to the exemplary embodiment.
Figure 35:
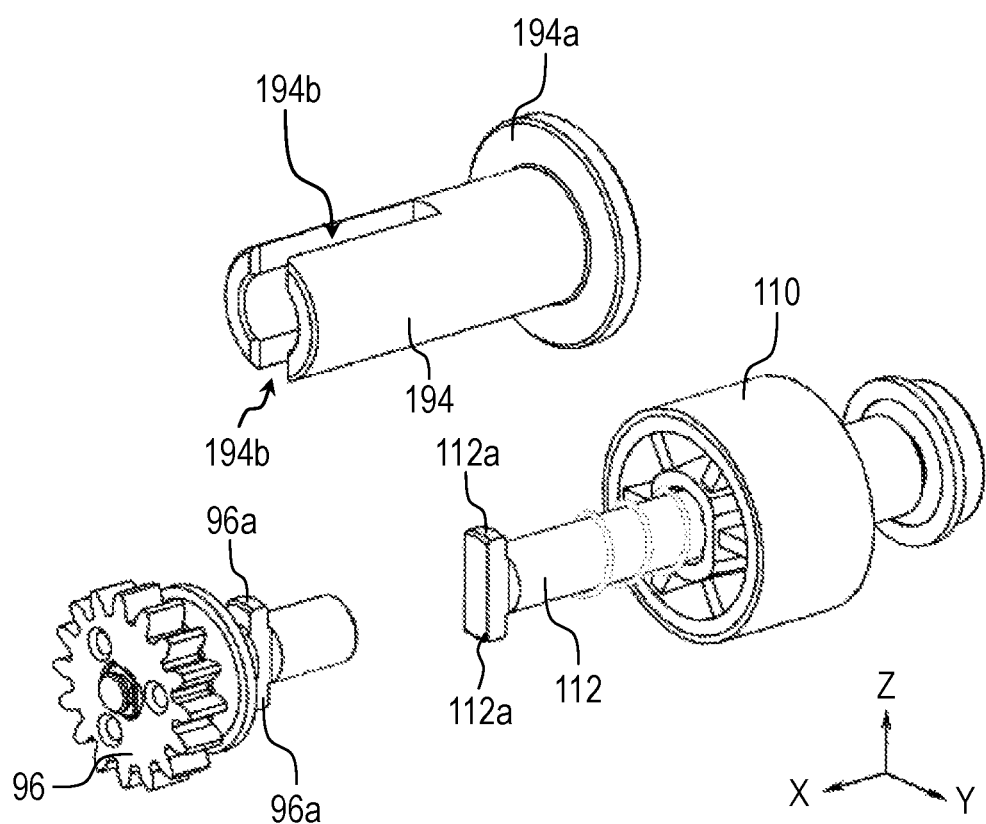
FIG. 35 is a perspective view showing the drive gear and the power transmission shaft in a state where the slide sleeve of the clutch mechanism according to the exemplary embodiment is removed.
Figure 36:
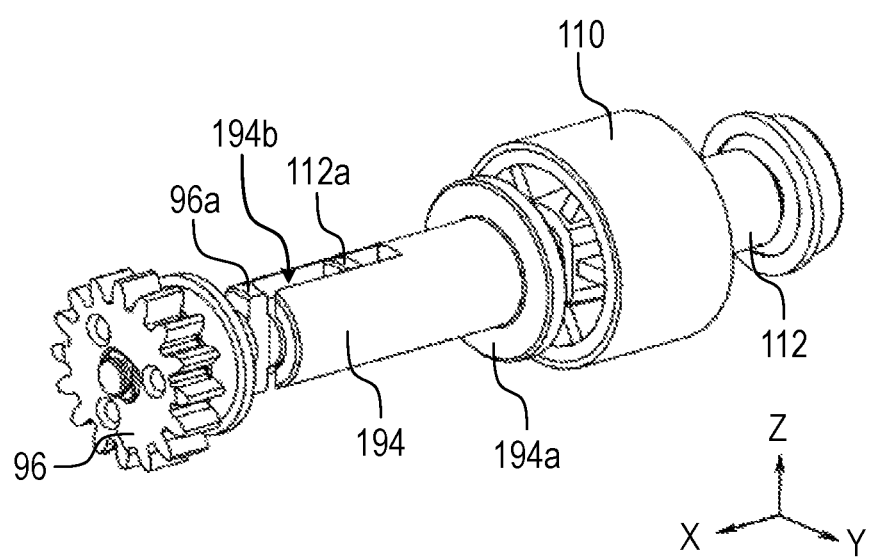
FIG. 36 is a perspective view showing the drive gear and the power transmission shaft in a state where a drive connection by the slide sleeve of the clutch mechanism according to the exemplary embodiment is released.

FIG. 34 is a view showing drive gear 96 and power transmission shaft 112 in a state where drive gear 96 and power transmission shaft 112 are drivingly connected with each other by slide sleeve 194 of clutch mechanism 190 according to the exemplary embodiment. FIG. 35 is a view showing drive gear 96 and power transmission shaft 112 in a state where slide sleeve 194 of clutch mechanism 190 according to the exemplary embodiment is removed. FIG. 36 is a view showing drive gear 96 and power transmission shaft 112 in a state where a drive connection by slide sleeve 194 of clutch mechanism 190 according to the exemplary embodiment is released.

As shown in FIG. 35, slide sleeve 194 has a pair of slits 194b extending from an end of slide sleeve 194 on a drive gear 96 side. Power transmission shaft 112 which is inserted into slide sleeve 194 has projecting portions 112a at the end of power transmission shaft 112 on the drive gear 96 side. Projecting portions 112a enter slits 194b formed on slide sleeve 194, and are engaged with slits 194b in a movable manner. Projecting portions 112a of power transmission shaft 112 are engaged with slits 194b formed on slide sleeve 194 so that power transmission shaft 112 and slide sleeve 194 are integrally rotated.

On the other hand, drive gear 96 also includes projecting portions 96a which enter slits 194b formed on slide sleeve 194, and are engaged with slits 194b in a movable manner. Projecting portions 96a of drive gear 96 are engaged with slits 194b formed on slide sleeve 194 so that power transmission shaft 112, slide sleeve 194, and drive gear 96 are integrally rotated. With such a configuration, front pinion 92 and rear pinion 122L of magazine carrier unit 70 are driven by motor 106.

As shown in FIG. 33, when contact portion 114a of clutch lever 114 is brought into contact with flange portion 194a of slide sleeve 194 due to swinging of clutch lever 114, slide sleeve 194 is moved in a direction that slide sleeve 194 is separated from drive gear 96. Due to such a movement of slide sleeve 194, as shown in FIG. 36, projecting portions 96a of drive gear 96 are moved out from slits 194b formed on slide sleeve 194 so that engagement between projecting portions 96a and slits 194b is released. Thus, a drive connection between drive gear 96 and slide sleeve 194, that is, a drive connection between front pinion 92 and rear pinion 122L and motor 106 is released. As a result, front pinion 92 and rear pinion 122L are brought into a free rotation state.

Figure 37:
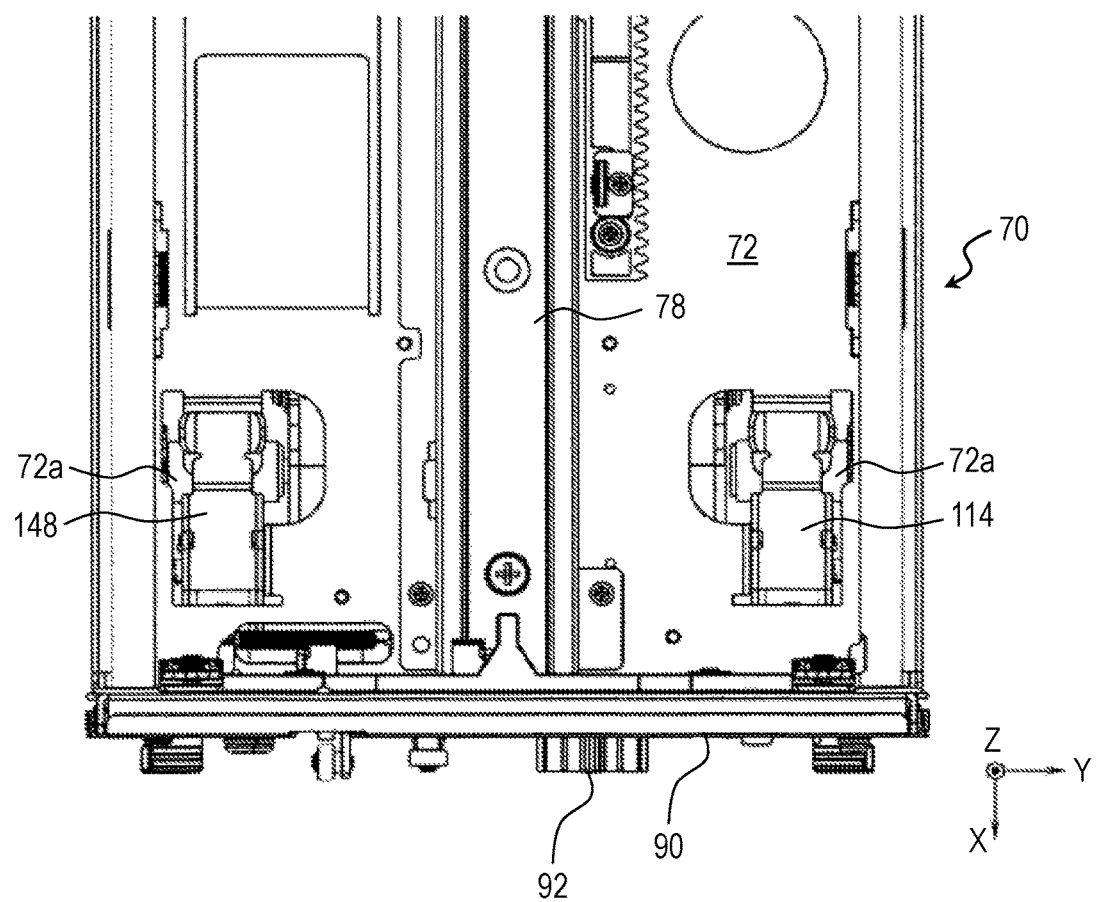
FIG. 37 is a top view of a front portion of a base portion of the magazine carrier unit according to the exemplary embodiment.

FIG. 37 is a top view of a front portion of base portion 72 of magazine carrier unit 70 according to the exemplary embodiment. As shown in FIG. 13, clutch mechanisms 190, 192, motors 106, 140 relating to clutch mechanisms 190, 192, and the like are mounted on a back side of base portion 72 of magazine carrier unit 70. Accordingly, as shown in FIG. 37, opening 72a is formed in base portion 72 for allowing a user to operate clutch lever 114, 148 of magazine carrier unit 70 standing by in bottom module 20, that is, for allowing the user to access to clutch lever 114, 148 from an upper surface side of base portion 72.

Before front rack 160 and rear racks 162L, 162R of bottom module 20, front rack 160 and rear racks 162L, 162R of main module 30, and front rack 160 and rear racks 162L, 162R of extension module 40 are connected with each other by moving front rack 160 and rear racks 162L, 162R of bottom module 20, the user operates clutch levers 114, 148 of clutch mechanisms 190, 192 so as to bring front pinion 92 and rear pinions 122L, 122R into a free rotation state. That is, front pinion 92 and rear pinions 122L, 122R which stand by in bottom module 20 and are meshed with front rack 160 and rear racks 162L, 162R of bottom module 20 are brought into a free rotation state. With such operations, front rack 160 and rear racks 162L, 162R of bottom module 20 can be smoothly moved with a small force toward front rack 160 and rear racks 162L, 162R of main module 30.

As has been described above, according to this exemplary embodiment, in conveyance robot apparatus 10 having the plurality of modules consisting of bottom module 20, main module 30, and extension module 40 and magazine carrier unit 70 which can move each of the respective modules, the construction and configuration change of conveyance robot apparatus 10 can be performed in a short time.

For example, as shown in FIG. 1, bottom module 20, main module 30, and extension module 40 are mounted on rack frame 300 in a state where bottom module 20, main module 30, and extension module 40 are arranged in a row in the Z axis direction. Next, front rack 160 and rear racks 162L, 162R which are supported on bottom module 20 in a slidable manner are moved, to connect front rack 160 and rear racks 162L, 162R of bottom module 20, front rack 160 and rear racks 162L, 162R of main module 30, and front rack 160 and rear racks 162L, 162R of extension module 40 with each other. With such operations, magazine carrier unit 70 can pass through the plurality of modules consisting of bottom module 20, main module 30, and extension module 40. That is, construction of conveyance robot apparatus 10 is completed.

Further, for example, as shown in FIG. 1, main module 30 disposed between bottom module 20 and extension module 40 can be exchanged without removing bottom module 20 and extension module 40 from rack frame 300.

This disclosure has been described by taking the above-mentioned exemplary embodiment as an example. However, this disclosure is not limited to the above-mentioned exemplary embodiment.

In the case of the above-mentioned exemplary embodiment, front rack 160 and rear racks 162L, 162R of bottom module 20 are moved toward front rack 160 and rear racks 162L, 162R of main module 30 independently by different rack connecting mechanisms. However, the exemplary embodiment of this disclosure is not limited to such a configuration. For example, front rack 160 and rear racks 162L, 162R of bottom module 20 may be simultaneously and integrally moved by the same rack connecting mechanism.

In the above-mentioned exemplary embodiment, front rack 160 and rear racks 162L, 162R of bottom module 20, front rack 160 and rear racks 162L, 162R of main module 30, and front rack 160 and rear racks 162L, 162R of extension module 40 are connected with each other by moving front rack 160 and rear rack 162L, 162R of bottom module 20 disposed at the lowermost position in the upward direction. However, the exemplary embodiment of this disclosure is not limited to such a configuration.

For example, the conveyance robot apparatus may be configured such that racks for the plurality of modules arranged in a row in the vertical direction are connected with each other by moving the rack for the module disposed at the uppermost position among the plurality of modules in the downward direction. In this case, to separate each of the plurality of racks from other racks disposed adjacently to each rack when a connection between the plurality of racks is released by making the rack of the module disposed at the uppermost position retract in the upward direction, each of the plurality of racks is biased in the upward direction by a biasing part such as a spring.

In the above-mentioned exemplary embodiment, the plurality of modules of the conveyance robot apparatus are arranged in a row in the Z axis direction as shown in FIG. 1. However, the exemplary embodiment of this disclosure is not limited to such a configuration.

For example, the plurality of modules may be arranged in a row in the horizontal direction. In this case, the robot passes through each of the plurality of modules in the horizontal direction. Further, to separate each of the plurality of racks from other racks disposed adjacently to each rack when a connection between the racks for the plurality of modules is released, each of the plurality of racks is biased in the horizontal direction by a biasing part formed of a spring or the like.

That is, in a broad sense, the conveyance robot apparatus according to the exemplary embodiment of this disclosure includes: the plurality of modules arranged in a row in the first direction; the robot capable of moving each of the plurality of modules in the first direction; the pinion mounted on the robot; the plurality of racks which are respectively supported on the plurality of modules in a slidable manner in the first direction, are meshable with the pinion, and are arranged in a row in the first direction; and a rack connecting mechanism configured to connect adjacent racks each other with respect to the plurality of racks arranged in a row in the first direction, by making at least one of the racks positioned at one terminal end slide toward at least one of the racks positioned at another terminal end.

This disclosure is applicable to a conveyance robot apparatus which includes a plurality of modules and a robot capable of moving each of the plurality of modules.

What is claimed is:

1. A conveyance robot apparatus comprising:
a plurality of modules positioned in a row in a first direction, the plurality of modules including a first module and a second module;
a robot comprising traversal elements configured to traverse a path segment adjacent to the plurality of modules for acting on the plurality of modules including the first module and the second module;
a pinion mounted on the robot;
a plurality of racks including a first rack and a second rack respectively supported on the plurality of modules including the first module and the second module in a slidable manner in the first direction, the plurality of racks including the first rack and the second rack being meshable with the pinion, the first module having the first rack supported on the first module in the slidable manner in the first direction, the second module having the second rack supported on the second module in the slidable manner in the first direction, and the first module and the second module being positioned in the row in the first direction; and
a rack connecting mechanism configured to connect the first rack and the second rack to each other, by making the first rack positioned at a first terminal end slide in the first direction toward the second rack positioned at a second terminal end.

2. The conveyance robot apparatus according to claim 1, wherein the rack connecting mechanism is further configured to separate the first rack and the second rack, by separating the first rack positioned at the first terminal end from the second rack positioned at the second terminal end in a state in which the first rack is connected to the second rack.

3. The conveyance robot apparatus according to claim 2, wherein:
the first direction contains at least a vertical component, and
the rack connecting mechanism is configured to separate the first rack from the second rack due to a weight of the first rack, by separating the first rack positioned at the first terminal end from the second rack positioned at the second terminal end in a state in which the first rack is connected to the second rack.

4. The conveyance robot apparatus according to claim 1, wherein among the plurality of modules positioned in the row in the first direction, the first module positioned at the first terminal end has a space for the robot to stand by and the rack connecting mechanism.

5. The conveyance robot apparatus according to claim 1, further comprising:
a clutch mechanism configured to release a drive connection between the pinion and a drive source configured to drive the pinion so as to allow free rotation of the pinion during movement of the plurality of racks by the rack connecting mechanism.

* * * * *